(12) United States Patent
Kawamura

(10) Patent No.: US 6,259,630 B1
(45) Date of Patent: *Jul. 10, 2001

(54) NONVOLATILE SEMICONDUCTOR MEMORY DEVICE EQUIPPED WITH VERIFICATION CIRCUIT FOR IDENTIFYING THE ADDRESS OF A DEFECTIVE CELL

(75) Inventor: Shoichi Kawamura, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/541,687

(22) Filed: Apr. 3, 2000

(30) Foreign Application Priority Data

Jul. 26, 1999 (JP) .................................................. 11-210843

(51) Int. Cl.[7] ..................................................... G11C 16/34
(52) U.S. Cl. ............................... 365/185.22; 365/185.12; 365/185.11; 365/185.09
(58) Field of Search ......................... 365/185.22, 185.12, 365/185.11, 185.09

(56) References Cited

U.S. PATENT DOCUMENTS

| | | | |
|---|---|---|---|
| 4,253,059 | * 2/1981 | Bell et al. | 714/721 |
| 4,393,475 | * 7/1983 | Kitagawa et al. | 365/185.21 |
| 4,763,305 | * 8/1988 | Kuo | 365/185.22 |
| 4,779,272 | * 10/1988 | Kohda et al. | 365/185.2 |
| 4,811,294 | * 3/1989 | Kobayashi et al. | 365/185.22 |
| 5,638,326 | 6/1997 | Hollmer et al. | 365/185.2 |
| 5,835,414 | 11/1998 | Hung et al. | 365/185.25 |

\* cited by examiner

*Primary Examiner*—Andrew Q. Tran
(74) *Attorney, Agent, or Firm*—Arent Fox Kintner Plotkin & Kahn, PLLC

(57) ABSTRACT

A nonvolatile semiconductor memory device has an array of memory cells in columns and rows, and has word lines and bit lines provided in orthogonal directions, the memory cells for each column sharing one of the bit lines, and the memory cells for each row sharing one of the word lines. The memory device includes a plurality of subblocks of N page buffers where N is a given positive integer, the N page buffers for each subblock temporarily storing data bits that are written to or erased from N memory cells at a time in the memory array in response to a selected one of the word lines. A verify/output circuit produces, in response to signals output by the plurality of subblocks of N page buffers, a verify status of each of the respective subblocks that indicates whether the data bits are properly written to or erased from the N memory cells, the verify/output circuit outputting the verify status of at least one of the plurality of subblocks to an external device.

10 Claims, 15 Drawing Sheets

NONVOLATILE SEMICONDUCTOR MEMORY DEVICE EQUIPPED WITH VERIFICATION CIRCUIT FOR IDENTIFYING THE ADDRESS OF A DEFECTIVE CELL

BACKGROUND OF THE INVENTION

1. Field of the Invention

The present invention generally relates to a nonvolatile semiconductor memory device, and more particularly to a nonvolatile semiconductor memory device, such as a flash memory, including a number of memory cells for storing data bits that are written or erased at a time.

2. Description of the Related Art

Nonvolatile semiconductor memory devices, such as a flash memory, are often used as storage of input data, like files. When writing at a time data bits to a number of memory cells of the nonvolatile semiconductor memory device, page buffers are used to temporarily store the data bits at the same time. The page size of the page buffers is, for example, 512 bytes. Also, when erasing at a time data bits from a number of memory cells of the nonvolatile semiconductor memory device, the page buffers are used to temporarily store the data bits at the same time. The page size of the page buffers is, for example, 8 K bytes.

Generally, after the data bits are written to or erased from the memory cells of the nonvolatile semiconductor memory device, a defect in any of the memory cells may arise with a certain probability. In order to check if a defect in the memory cells of the memory device has occurred, a verification operation is automatically performed on the memory device every time the memory device is written to or erased.

For example, a write verify operation is repeated several times on the memory device when the data bits are written to the memory cells, which produces a verify status information that indicates whether the data bits are properly written to the memory cells. An erase verify operation is repeated several times on the memory device when the data bits are erased from the memory cells, which produces a verify status information that indicates whether the data bits are properly erased from the memory cells.

If a certain command is externally input to the memory device, external devices can have access to the verify status information stored in the memory device.

FIG. 16 shows a conventional flash memory which can provide the verify status information to external devices.

As shown in FIG. 16, the conventional flash memory includes a controller 300, a memory array 301, a plurality of page buffers 302, a verification circuit 303, an output circuit 306, and a latch circuit 307.

The controller 300 controls the entire conventional flash memory.

The memory array 301 includes an array of memory cells in columns and rows, and includes word lines and bit lines provided in orthogonal directions, the memory cells for each column sharing one of the bit lines, and the memory cells for each row sharing one of the word lines.

The plurality of page buffers 302 are connected to the memory cells of the memory array 301 via the bit lines. The plurality of page buffers 302 are divided into "M" subblocks 302-0 through 302-(M−1) where M is a given positive integer. Each of the M subblocks contains a number of page buffers 302. The M subblocks of page buffers 302-0 through 302-(M−1) are provided to temporarily store the data bits which are written to or erased from the memory cells of the memory array 301.

The output circuit 306 is divided into "N" subblocks 306-0 through 306-(N−1) where N is a given positive integer. The N subblocks of the output circuit 306 are provided to output N pieces of data (or data1 through data(N−1)) which are received from a data bus.

The conventional flash memory of FIG. 16 includes "N" input/output pins 100 through IO(N−1), and the number M of the page buffer subblocks may be the same as the number N of the input/output pins. The subblocks 306-0 through 306-(N−1) of the output circuit 306 respectively correspond to the input/output pins 100 through IO(N−1).

The verification circuit 303 is provided to output a verify status information indicating the result of a write verify operation or an erase verify operation performed on the memory cells in the memory array 301. The operation of the verification circuit 303 is controlled by the controller 300.

The verification circuit 303 is connected to the M subblocks of the page buffers 302-0 through 302-(M−1) via a common PV signal line. After the write verify operation is performed, the verification circuit 303 receives a write verify signal PV sent on the common PV signal line by the page buffers 302-0 through 302-(M−1). When at least one of the memory cells corresponding to the above page buffers is found defective, the write verify signal PV is set to the low level. When all of the memory cells corresponding to the above page buffers are found normal, the write verify signal PV is set to the high level. The verification circuit 303 outputs a verify status signal VPASS in response to the write verify signal PV, the verify status signal VPASS at this time indicating the result of the write verify operation.

Further, the verification circuit 303 is connected to the M subblocks of the page buffers 302-0 through 302-(M−1) via a common EV signal line. After the erase verify operation is performed, the verification circuit 303 receives an erase verify signal EV sent on the common EV signal line by the page buffers 302-0 through 302-(M−1). When at least one of the memory cells corresponding to the above page buffers is found defective, the erase verify signal EV is set to the low level. When all of the memory cells corresponding to the above page buffers are found normal, the erase verify signal EV is set to the high level. The verification circuit 303 outputs a verify status signal VPASS in response to the erase verify signal EV, the verify status signal VPASS at this time indicating the result of the erase verify operation.

The verify status signal VPASS output by the verification circuit 303 is delivered to the subblock 306-0 (corresponding to the pin IO0) of the output circuit 306 via the latch circuit 307. When a defective cell in the memory cells is found as the result of the verify operation, a signal, indicating the content of the verify status signal VPASS, is output from the pin IO0 of the conventional flash memory to an external device.

However, there exist some circumstances in which the memory device can still be used as the storage of input data, even when the output signal of the pin IO0 indicates the occurrence of a defect in the memory array. For example, if the external device is equipped with an error correction circuit, or if the defective cell is located in an unrelated region of the memory array, the memory device can still be used for storage of input data. In such circumstances, it is necessary to quickly identify the location of a defective cell in the memory device.

In the above-mentioned conventional flash memory, the location of the defective cell in the memory array is not yet identified at the time when the output signal of the pin IO0 indicates the occurrence of a defect in the memory array. In order to identify the location of the defective cell, a predetermined command is input to the conventional flash memory, and the contents of the page buffers 302-0 through 302-(M−1) must be read out from the conventional flash memory. This read-out operation is performed on the above page buffers in accordance with an externally supplied clock.

If the defective cell are located at the last address of the memory array as the result of the write verify operation (the page size is 512 bytes), a time period corresponding to 512 clocks is needed to perform the read-out operation that identifies the location of the defective cell in the memory array. If a cycle time of the clock are $50 \times 10^{-9}$ seconds, the time period corresponding to the 512 clocks needed for the above case amounts to $25.6 \times 10^{-6}$. In a case of the erase verify operation, the needed time period will be further increased.

Accordingly, it is difficult for the conventional flash memory to quickly identify the location of any defective cell which may be revealed in the memory array after it is written to or erased.

SUMMARY OF THE INVENTION

In order to overcome the problems described above, preferred embodiments of the present invention provide an improved nonvolatile semiconductor memory device that provides high-speed access to the identification of the address of any defective cell which may be revealed in the memory array after it is written to or erased.

According to one preferred embodiment of the present invention, a nonvolatile semiconductor memory device has an array of memory cells in columns and rows, and has word lines and bit lines provided in orthogonal directions, the memory cells for each column sharing one of the bit lines, and the memory cells for each row sharing one of the word lines, the memory device comprising: a plurality of subblocks of N page buffers where N is a given positive integer, the N page buffers for each subblock temporarily storing data bits that are written to N memory cells at a time in the memory array in response to a selected one of the word lines; and a verify/output circuit which produces, in response to signals output by the plurality of subblocks of N page buffers, a verify status of each of the respective subblocks that indicates whether the data bits are properly written to the N memory cells, the verify/output circuit outputting the verify status of at least one of the plurality of subblocks to an external device.

In the nonvolatile semiconductor memory device of the present embodiment, the verify/output circuit can output the verify status of each of the subblocks of N page buffers to the external device. The amount of data needed to identify the location of a defective cell is remarkably reduced in comparison with that of the conventional flash memory. The nonvolatile semiconductor memory device of the present invention is effective in providing high-speed access to the identification of the address of any defective cell in the memory array after it is written.

According to another preferred embodiment of the present invention, a nonvolatile semiconductor memory device has an array of memory cells in columns and rows, and has word lines and bit lines provided in orthogonal directions, the memory cells for each column sharing one of the bit lines, and the memory cells for each row sharing one of the word lines, the memory device comprising: a plurality of subblocks of N page buffers where N is a given positive integer, the N page buffers for each subblock temporarily storing data bits that are erased from N memory cells at a time in the memory array in response to a selected one of the word lines; and a verify/output circuit which produces, in response to signals output by the plurality of subblocks of N page buffers, a verify status of each of the respective subblocks that indicates whether the data bits are properly erased from the N memory cells, the verify/output circuit outputting the verify status of at least one of the plurality of subblocks to an external device.

In the nonvolatile semiconductor memory device of the present embodiment, the verify/output circuit can output the verify status of each of the subblocks of N page buffers to the external device. The amount of data needed to identify the location of a defective cell is remarkably reduced in comparison with that of the conventional flash memory. The nonvolatile semiconductor memory device of the present invention is effective in providing high-speed access to the identification of the address of any defective cell in the memory array after it is erased.

BRIEF DESCRIPTION OF THE DRAWINGS

Other objects, features and advantages of the present invention will become apparent from the following detailed description when read in conjunction with the accompanying drawings in which.

DETAILED DESCRIPTION OF PREFERRED EMBODIMENTS

A description will now be provided of preferred embodiments of the present invention with reference to the accompanying drawings.

Figure 1:
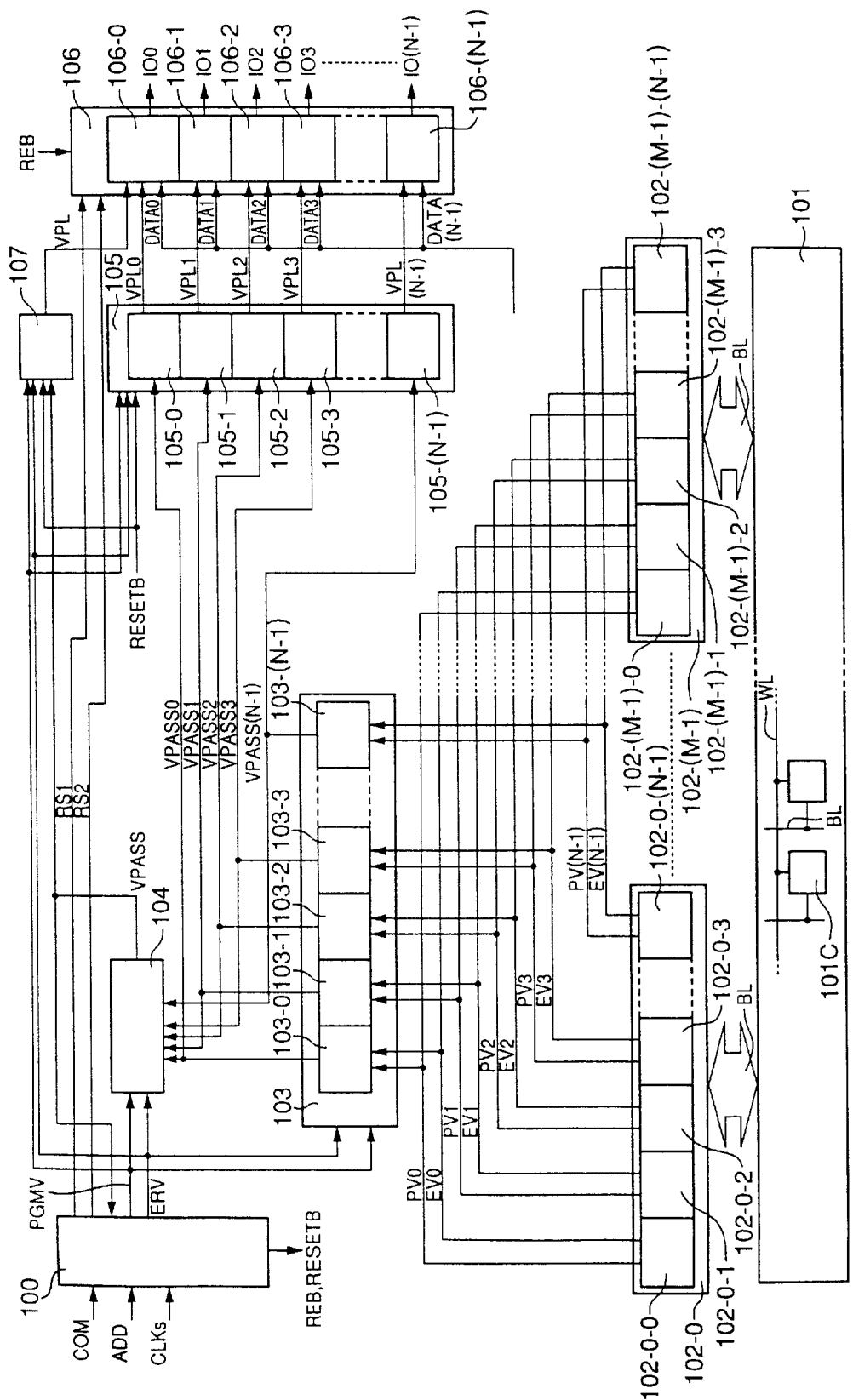
FIG. 1 is a block diagram of a flash memory to which a nonvolatile semiconductor memory device of one preferred embodiment of the invention is applied.

FIG. 1 is a block diagram of a flash memory to which a nonvolatile semiconductor memory device of one preferred embodiment of the invention is applied.

The flash memory of the present embodiment is configured to quickly output the identification of the address of a defective cell which may exist in the memory array after it is written or erased. As shown in FIG. 1, the flash memory of the present embodiment generally comprises a controller 100, a memory array 101, a plurality of page buffers 102, a verification circuit 103, a verify status output circuit 104, a first latch circuit 105, an output circuit 106, and a second latch circuit 107.

The flash memory of the present embodiment includes various other processing circuits in addition to the above-mentioned elements. In the following, however, a description of the above-mentioned elements of the present embodiment will be provided and a description of the other processing circuits will be omitted, for the sake of simplicity of description.

The controller 100 controls the entire flash memory. The controller 100 receives various input signals, such as an input command COM, an input address ADD, an input clock CLK and etc., which are externally supplied to the flash memory. The controller 100 outputs various control signals, in response to the above input signals, such as a write verify control signal PGMV, an erase verify control signal ERV, a total-verify-status output control signal RS1, a partial-verify-status output control signal RS2, and etc. Further, the controller 100 outputs a read enable signal REB, a reset signal RESET, and etc.

The memory array 101 includes an array of memory cells 101C in columns and rows, and includes word lines WL and bit lines BL provided in orthogonal directions, the memory cells 101C for each column sharing one of the bit lines BL, and the memory cells 101C for each row sharing one of the word lines WL.

In the memory array 101, each memory cell 101C includes a transistor (not shown) and this transistor is provided with a floating gate. The transistor is connected to one of the word lines WL. The electrons are injected in or removed from the floating gate in response to the potential of the asserted or negated word line on the transistor. The memory cell lOIC retains a "1" or "0" state in accordance with such a potential of the floating gate. After the data bit is erased from the memory cell 101C, the "1" state is retained in the memory cell 101C. After the data bit is written to the memory cell 101C, the "0" state is retained in the memory cell 101C. The drain of the transistor of each memory cell 101C is connected to one of the bit lines BL. When reading the memory cell 101C, the level of the bit line BL is sensed and amplified so that the data bit stored in the memory cell 101C is read out by an external device.

The plurality of page buffers 102 are connected to the memory cells of the memory array 101 via the bit lines BL. The plurality of page buffers 102 are divided into "M" subblocks 102-0 through 102-(M-1) where M is a given positive integer. Each of the M subblocks is further divided into "N" page buffers 0 through (N-1) where N is a given positive integer. The M subblocks of page buffers 102-0 through 102-(M-1) are provided to temporarily store the data bits which are written to or erased from the memory cells of the memory array 101. The plurality of page buffers 102 are thus configured into the M subblocks of N page buffers.

In the present embodiment, the n-th element page buffers each out of the individual subblocks of N page buffers 102-0 through 102-(M-1), corresponding to the same element number "n", are connected to the verification circuit 103 via a common PV signal line and via a common EV signal line, as shown in FIG. 1.

For example, the 0-th element page buffers 102-0-0 through 102-(M-1)-0 corresponding to the same element number n=0 are connected to the verification circuit 103 via a common signal line PV0 and via a common signal line EV0. The flash memory of the present embodiment includes the common signal lines PV0 through PV(N-1) and the common signal lines EV0 through EV(N-1). This configuration enables the reduction of the time period needed to identify the location of a defective cell in the memory array to 1/N of the time period needed by the conventional flash memory.

In the flash memory of the present embodiment, the verification circuit 103, the verify status output circuit 104, the first latch circuit 105, the output circuit 106, and the second latch circuit 107 constitute a verify/output circuit. The verify/output circuit produces, in response to signals output by the M subblocks of N page buffers 102, a verify status of each of the respective subblocks that indicates whether the data bits are properly written to the N memory cells. The verify/output circuit outputs the verify status of at least one of the M subblocks to an external device.

The output circuit 106 is divided into "N" subblocks 106-0 through 106-(N-1) where N is the same positive integer as that described above. The N subblocks of the output circuit 106 are provided to output N pieces of data (or DATA1 through DATA(N-1)) which are received from a data bus.

The flash memory of the present embodiment includes "N" input/output pins 100 through IO(N-1), and the number M of the page buffer subblocks may be the same as the number N of the input/output pins. The subblocks 106-0 through 106-(N-1) of the output circuit 106 are respectively connected to the input/output pins IO0 through IO(N-1).

The verification circuit 103 is provided to output a verify status information indicating the result of a write verify operation or an erase verify operation performed on the memory cells in the memory array 101. The operation of the verification circuit 103 is controlled by the controller 100. The verification circuit 103 is divided into "N" subblocks 103-0 through 103-(N-1) where N is the same positive integer as that described above. One of the subblocks of the verification circuit 103 corresponds to the n-th element page buffers each out of the individual subblocks of N page buffers 102-0 through 102-(M-1).

After the write verify operation is performed, each subblock of the verification circuit 103 receives a corresponding write verify signal PV sent on the corresponding PV signal line by the M subblocks of page buffers. As shown, the verification circuit 103 receives at this time the respective write verify signals on the PV signal lines PV0 through PV(N-1) sent by the M subblocks of page buffers. When at least one of the memory cells corresponding to the n-th element page buffers is found to be defective, the corresponding write verify signal PV is set to the low level. When all of the memory cells corresponding to the n-th element page buffers are found to be normal, the corresponding write verify signal PV is set to the high level. The verification circuit 103 outputs verify status signals VPASS0 through VPASS(N−1) in response to the write verify signals PV0 through PV(N−1), each verify status signal VPASS at this time indicating the result of the write verify operation.

Further, after the erase verify operation is performed, each subblock of the verification circuit 103 receives a corresponding erase verify signal EV sent on the corresponding EV signal line by the M subblocks of page buffers. As shown, the verification circuit 103 receives at this time the respective erase verify signals on the EV signal lines EV0 through EV(N−1) sent by the M subblocks of page buffers. When at least one of the memory cells corresponding to the n-th element page buffers is found defective, the corresponding erase verify signal EV is set to the low level. When all of the memory cells corresponding to the nth element page buffers are found normal, the corresponding erase verify signal EV is set to the high level. The verification circuit 103 outputs the verify status signals VPASS0 through VPASS(N−1) in response to the erase verify signals EV0 through EV(N−1), each verify status signal VPASS at this time indicating the result of the erase verify operation.

The verify status signals VPASS0 through VPASS(N−1) output by the respective subblocks of the verification circuit 103 are delivered to both the verify status output circuit 104 and the first latch circuit 105.

The first latch circuit 105 is divided into N subblocks 105-0 through 105-(N−1) where N is the same integer as that described above. Each of the subblocks 105-0 through 105-(N−1) of the first latch circuit 105 receives one of the verify status signals VPASS0 through VPASS(N−1) sent by the verification circuit 103, temporarily stores the same signal, and outputs a corresponding signal VPL in response to the same signal. The first latch circuit 105 outputs the respective signals VPL0 through VPL(N−1) to the subblocks 106-0 through 106-(N−1) of the output circuit 106. When a defective cell in the memory cells is found as the result of the verify operation, the signals VPL0 through VPL(N−1), received at the output circuit 106, specifically indicate which subblock of the page buffers 102 contains the defective cell. This verify result information is delivered from the output circuit 106 to the external device.

The verify status output circuit 104 receives all of the verify status signals VPASS0 through VPASS(N−1) sent by the verification circuit 103, and temporarily stores the same. When at least one of the verify status signals indicates the occurrence of a defect in the memory cells, the verify status output circuit 104 outputs a total-verify-status signal VPASS indicating the occurrence of any defect in the entire memory device after it is written or erased. Otherwise the verify status output circuit 104 outputs the total-verify-status signal VPASS indicating the normal state of the entire memory device after it is written or erased. The total-verify-status signal VPASS output by the verify status output circuit 104 is delivered to both the controller 100 and the second latch circuit 107.

In the present embodiment, by contrast to the above total-verify-status signal VPASS, the individual verify status signals VPASS0 through VPASS(N−1) are called the partial-verify-status signals.

As described above, the output circuit 106 includes the N subblocks 106-0 through 106-(N−1). Data signals DATA0 through DATA(N−1) sent from a data bus are supplied to the subblocks 106-0 through 106-(N−1) of the output circuit 106. When outputting the data signals from the flash memory, the data signals are delivered from the output circuit 106 to the input/output pins 100 through IO(N−1). Hence, the data signals DATA0 through DATA(N−1) are output at the pins 100 through IO(N−1) of the flash memory.

Further, the flash memory of the present embodiment uses the pins 100 through IO(N−1) to output the verify status information that is supplied by the first latch circuit 105 to the output circuit 106. The output of the verify status information is controlled by the controller 100. When the read enable signal REB output by the controller 100 falls, the verify status signals VPL0 through VPL(N−1) are output from the pins 100 through IO(N−1). Among the subblocks of the output circuit 106, the first subblock 106-0 is different in function from the other subblocks 106-1 through 106-(N−1). The operation of the first subblock 106-0 is controlled in accordance with the control signal RS1 sent by the controller 100.

The second latch circuit 107 receives the total-verify-status signal VPASS sent by the verify status output circuit 104, and temporarily stores the same signal. The second latch circuit 107 outputs a responsive signal VPL for this signal VPASS to the first subblock 106-0 of the output circuit 106. The signal VPL is delivered from the first subblock 106-0 to the pin IO0 of the flash memory.

Figure 2:
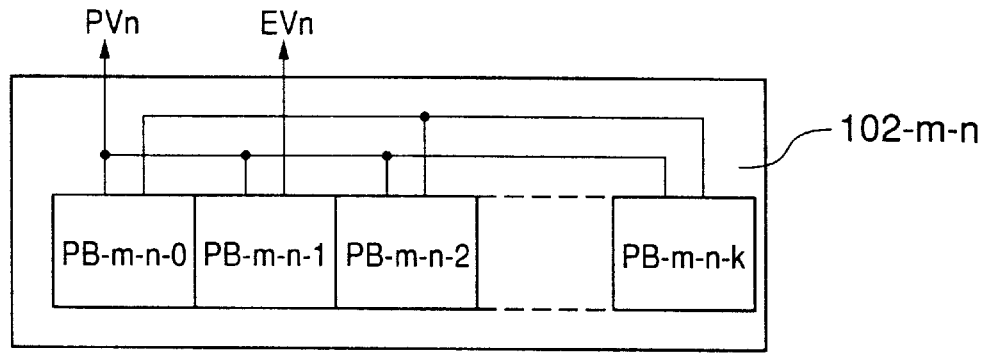
FIG. 2 is a block diagram of one of a plurality of subblocks of page buffers in the flash memory.

FIG. 2 shows one of the plurality of subblocks of page buffers in the flash memory.

As shown in FIG. 2, a subblock 102-m-n of page buffers in the present embodiment is one of the plurality of subblocks of page buffers 102 in the flash memory of FIG. 1. The subscript (m-n) indicates that this subblock is the n-th element of the m-th element subblocks among the M subblocks in the flash memory. The subblock 102-m-n includes the page buffers PB-m-n-0 through PB-m-n-k. It is supposed, for example, that the subblock 102-m-n contains (k+1) page buffers. Each page buffer in the subblock 102-m-n outputs the write verify signal PVn and the erase verify signal EVn.

Figure 3:
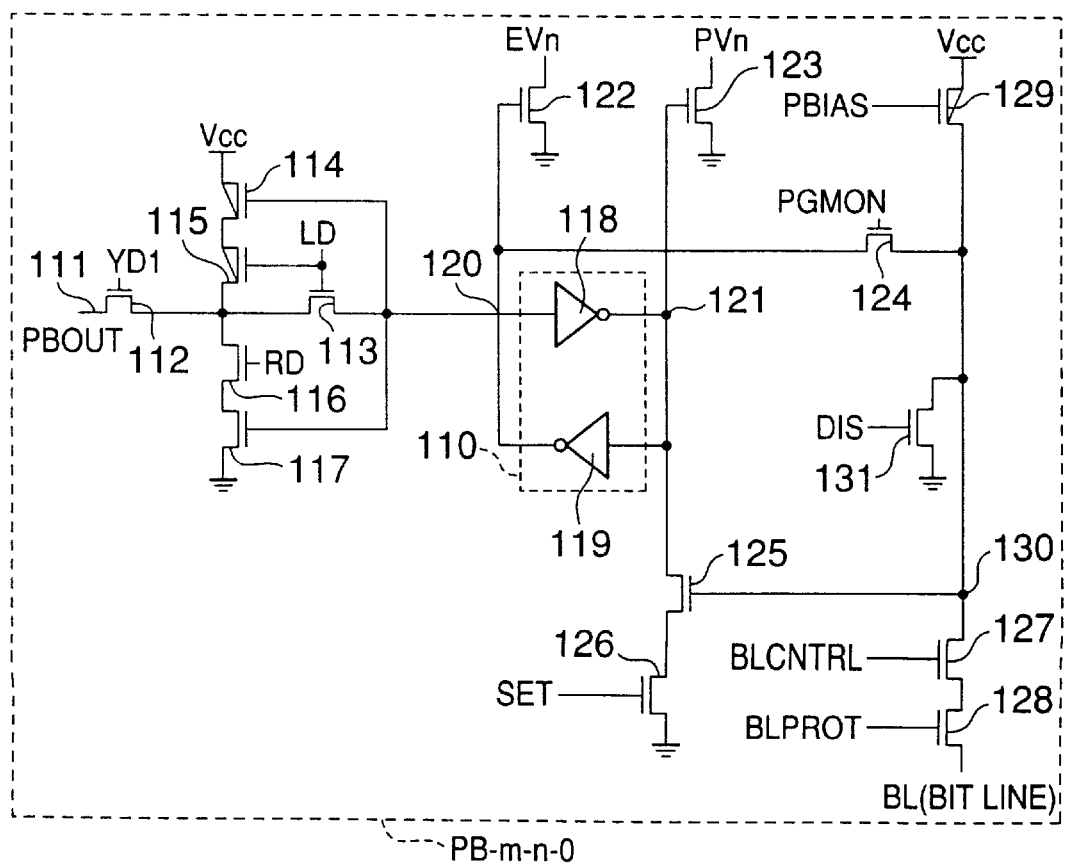
FIG. 3 is a circuit diagram of a page buffer provided as one of the page buffers contained in the page buffer subblock of FIG. 2.

FIG. 3 shows a page buffer which is provided as one of the page buffers contained in the page buffer subblock of FIG. 2.

In FIG. 3, the node 111 is connected to the data bus and provided to either output data retained by a latch circuit 110 or receive data to be written to the page buffer. In the flash memory of the present embodiment, the controller 100 outputs the control signals LD, RD, YD1, PBIBS, PGMON, SET, BLCNTRL and BLPROT to the page buffer PB-m-n-0 of FIG. 3.

As shown in FIG. 3, in the page buffer PB-m-n-0, the node 111 is connected to a pair of transfer gates 112 and 113, and the output of the transfer gate 113 is connected to a latch circuit 110. The page buffer select signal YD1 is input to the gate of the transfer gate 112. When the page buffer PB-m-n-0 is selected, the select signal YD1 is set to the high level.

The control signal LD is input to the gate of the transfer gate 113. When the write data is input to the latch circuit 110, the control signal LD is set to the high level. The control signal LD is also input to the gate of a p-channel MOS transistor 115. When the transfer gate 113 is turned on, the transistor 115 is turned off. A p-channel MOS transistor 114 and an n-channel MOS transistor 117 are connected between the source voltage Vcc and the ground voltage. The transistors 114 and 117 form an inverter, and this inverter is inactive when the transistor 115 is turned off. Another n-channel MOS transistor 116 is connected between the drain of the transistor 117 and the connection point of the transfer gates 112 and 113. The control signal RD is input to the gate of the transistor 116. When outputting the data bit latched by the latch circuit 110, the control signal RD is set to the high level.

In the page buffer PB-m-n-0 of FIG. 3, the latch circuit 110 includes an inverter 118 and an inverter 119, which are connected as shown. The node 120 is connected to both the input of the inverter 118 and the output of the inverter 119. The node 121 is connected to both the output of the inverter 118 and the input of the inverter 119. The node 120 is also connected to the gate of an n-channel MOS transistor 122. The transistor 122 has a source grounded and a drain connected to the EVn signal line for the erase verify signal EVn. A transistor 124 is connected at one end to the node 120 and connected at the other end to two switching transistors 127 and 128. The switching transistor 128 is connected to the bit line BL of the memory array 110.

The node 121 at the other end of the latch circuit 110 is connected to the gate of an n-channel MOS transistor 123. The transistor 123 has a source grounded and a drain connected to the PVn signal line for the write verify signal PVn. The node 121 is connected also to two n-channel MOS transistors 125 and 126. The transistor 126 has a source grounded.

The control signal PGMON is input to the gate of the transistor 124. When writing the corresponding memory cell, the control signal PGMON is set to the high level. When writing, the voltage at the node 120 of the latch circuit 110 is transferred to the bit line BL. The bit line control signal BLCNTRL is input to the gate of the transistor 127. The bit line protection signal BLPROT is input to the gate of the transistor 128. During the reading, writing and write/erase verify operations, the control signals BLCNTRL and BLPROT are set to the high level, and an electrical connection between the bit line BL and the corresponding buffer circuit is established. When erasing the memory cell, the control signals BLCNTRL and BLPROT are set to the low level, and the connection is cut off.

The output of the transistor 124 is connected to a p-channel MOS transistor 129. The transistor 129 is connected between the output of the transistor 124 and the source voltage line for the source voltage Vcc. The bias voltage PBIAS is input to the gate of the transistor 129. During the reading and write/erase verify operations, the bias voltage PBIAS is set to the low level to cause the sense current to flow into the bit line BL.

A sensing node 130 is provided at the connection point between the transistor 127 on the bit line BL and the transistor 129. A discharging transistor 131 is connected between the ground and the connection point of the transistors 129 and 130. The transistor 131 serves to cause the sensing node 130 to be charged or discharged. The discharge signal DIS is supplied to the gate of the transistor 131. When the discharge signal DIS is set to the high level, the voltage of the sensing node 130 is set to a low voltage.

The sensing node 130 is connected to the gate of the transistor 125. When the memory cell at the selected address is properly written and the voltage of the sensing node 130 is at the high level, the transistor 125 is turned on. The transistor 125 has a source connected to the transistor 126. The set signal is supplied to the gate of the transistor 126, and the transistor 126 is turned on or off in response to the level of the set signal SET. During the reading and write/erase verify operations, the set signal SET is set to the high level. The transistors 125 and 126 are responsive to the voltage of the sensing node 130 and serve to maintain the node 121 of the latch circuit 110 at the high level or to change the node 121 of the latch circuit 110 to the low level.

As described above, in the flash memory of the present embodiment, the controller 100 outputs the control signals LD, RD, YD1, PBIBS, PGMON, SET, BLCNTRL and BLPROT to the page buffer PB-m-n-0. The relationship between the control signals and the operations of the flash memory will be described later, with reference to FIG. 10 through FIG. 13.

Briefly speaking, at the time of the write verify operation, if the voltage at the node 121 of the latch circuit 110 is changed from the high level to the low level after the writing, it is verified that the memory cell at the selected address is properly written. On the other hand, if the voltage at the node 121 is maintained at the high level and the write verify signal PVn is set to the low level, it is indicating that the memory cell at the selected address is improperly written, or the writing results in a defective cell.

At the time of the erase verify operation, if the voltage at the node 121 of the latch circuit 110 is maintained at the high level and the voltage at the node 120 is maintained at the low level after the erasing, it is verified that the memory cell at the selected address is properly erased. The transistor 122 at this time remains off. If not, it is indicating that the memory cell at the selected address is improperly erased, or the erasing results in a defective cell.

Figure 4:
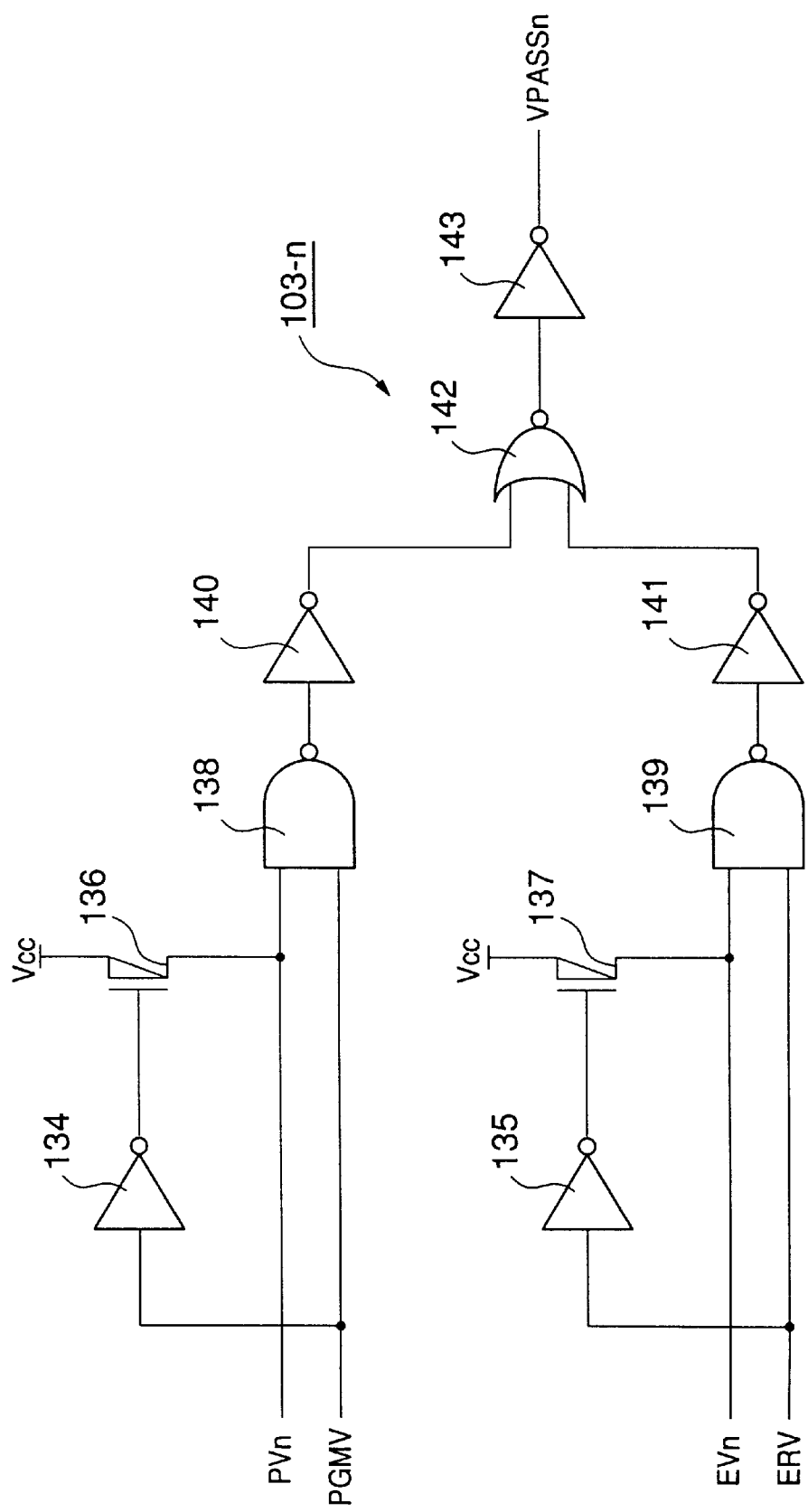
FIG. 4 is a circuit diagram of one of a plurality of subblocks of a verification circuit in the flash memory.

FIG. 4 shows one of the subblocks of the verification circuit 103 in the flash memory of FIG. 1.

As shown in FIG. 4, the verification-circuit subblock 103-n generally comprises an inverter 134, a p-channel MOS transistor 136, an NAND gate 138, an inverter 140, an inverter 135, a p-channel MOS transistor 137, an NAND gate 139, an inverter 141, an NOR gate 142, and an inverter 143. The NAND gate 138 and the inverter 140 are provided for the write verify operation. The NAND gate 139 and the inverter 141 are provided for the erase verify operation. The NOR gate 142 and the inverter 143 are provided for outputting the verify status signal VPASSn.

When the write verify control signal PGMV is set to the high level, the inverter 134 and the transistor 136 serve to shift the write verify signal PVn to the source voltage Vcc and to capture a change of the write verify signal PVn. When the erase verify control signal ERV is set to the high level, the inverter 135 and the transistor 137 serve to shift the erase verify signal EVn to the source voltage Vcc and to capture a change of the erase verify signal EVn.

When the control signal PGMV is set to the high level, the NAND gate 138 and the inverter 140 are activated to produce an output signal in response to the level of the write verify signal PVn. When the level of the write verify signal PVn is too low, the output of the inverter 140 is set to the low level. The output signal of the inverter 140 is sent to the NOR gate 142.

When the control signal ERV is set to the high level, the NAND gate 139 and the inverter 141 are activated to produce an output signal in response to the level of the erase verify signal EVn. When the level of the erase verify signal EVn is too low, the output of the inverter 141 is set to the low level. The output signal of the inverter 141 is sent to the NOR gate 142.

Accordingly, the verify status signal VPASSn, output by the verification-circuit subblock 103-n, is set to the low level when at least one of the write verify operation and the erase verify operation is found defective. Otherwise the verify status signal VPASSn is set to the high level.

Figure 5:
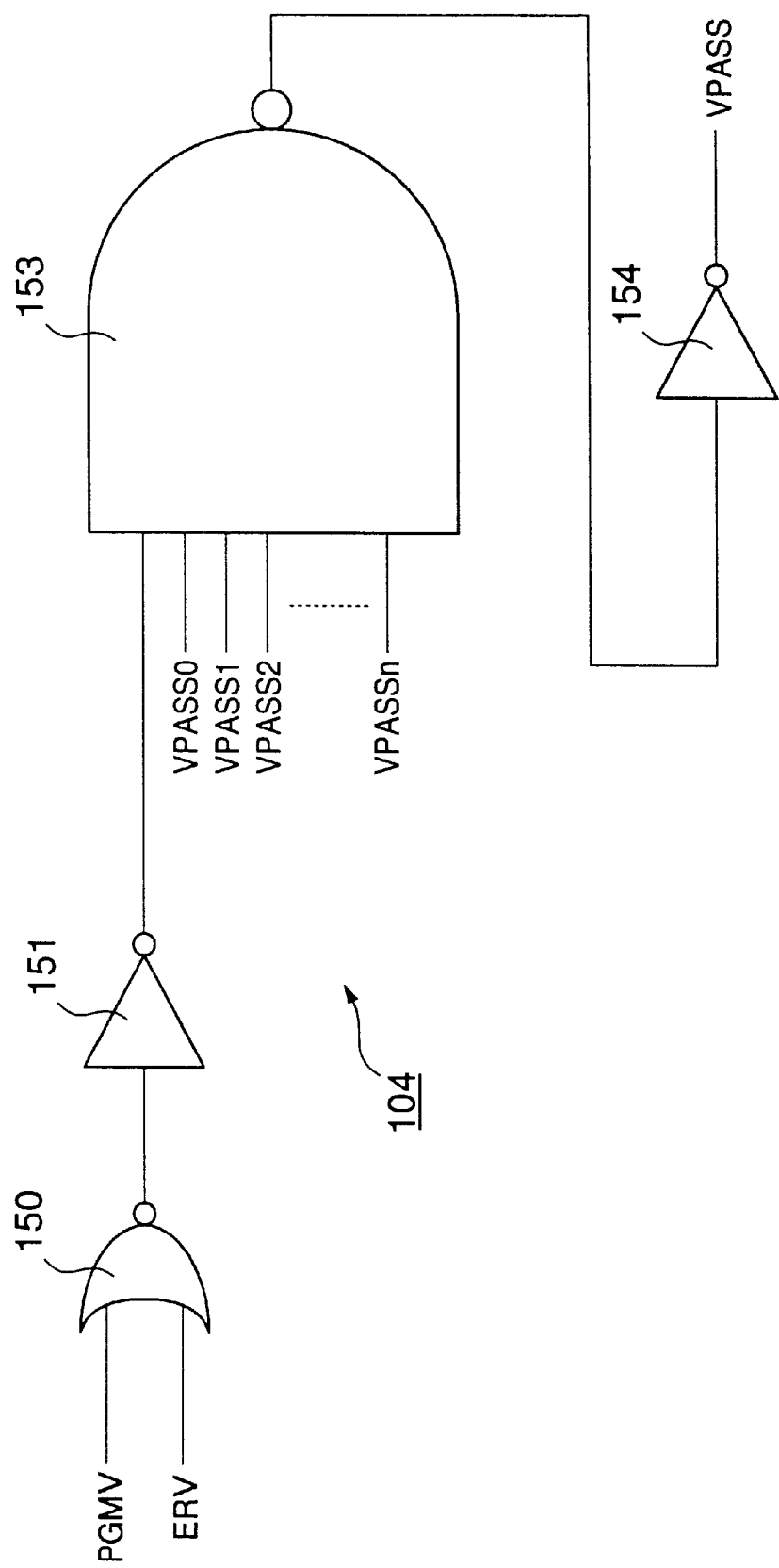
FIG. 5 is a circuit diagram of a verify status output circuit in the flash memory.

FIG. 5 shows the verify status output circuit 104 in the flash memory of FIG. 1.

As shown in FIG. 5, the verify status output circuit 104 generally comprises an NOR gate 150, an inverter 151, an NAND gate 153, and an inverter 154. The NOR gate 150 receives the write verify control signal PGMV and the erase verify control signal ERV, which are sent by the controller 100. The output of the NOR gate 150 is sent to the inverter 151, and the inverted-state signal is delivered from the inverter 151 to the NAND gate 153.

The NAND gate 153 receives the individual verify status signals VPASS0 through VPASS(N−1) which are sent by the verification circuit 103. When one of the control signals PGMV and ERV is set to the high level and all of the verify status signals VPASS0 through VPASS(N−1) are set to the high level, the signal output by the NAND gate 153 is set to the low level. Otherwise the signal output by the NAND gate 153 is set to the high level. The output of the NAND gate 153 is inverted by the inverter 154. Hence, the total-verify-status signal VPASS output by the verify status output circuit 104 is set to the low level when at least one of the signals VPASS0 through VPASS(N−1) indicates the occurrence of a defect in the memory cells. Otherwise the total-verify-status signal VPASS is set to the high level.

Figure 6:
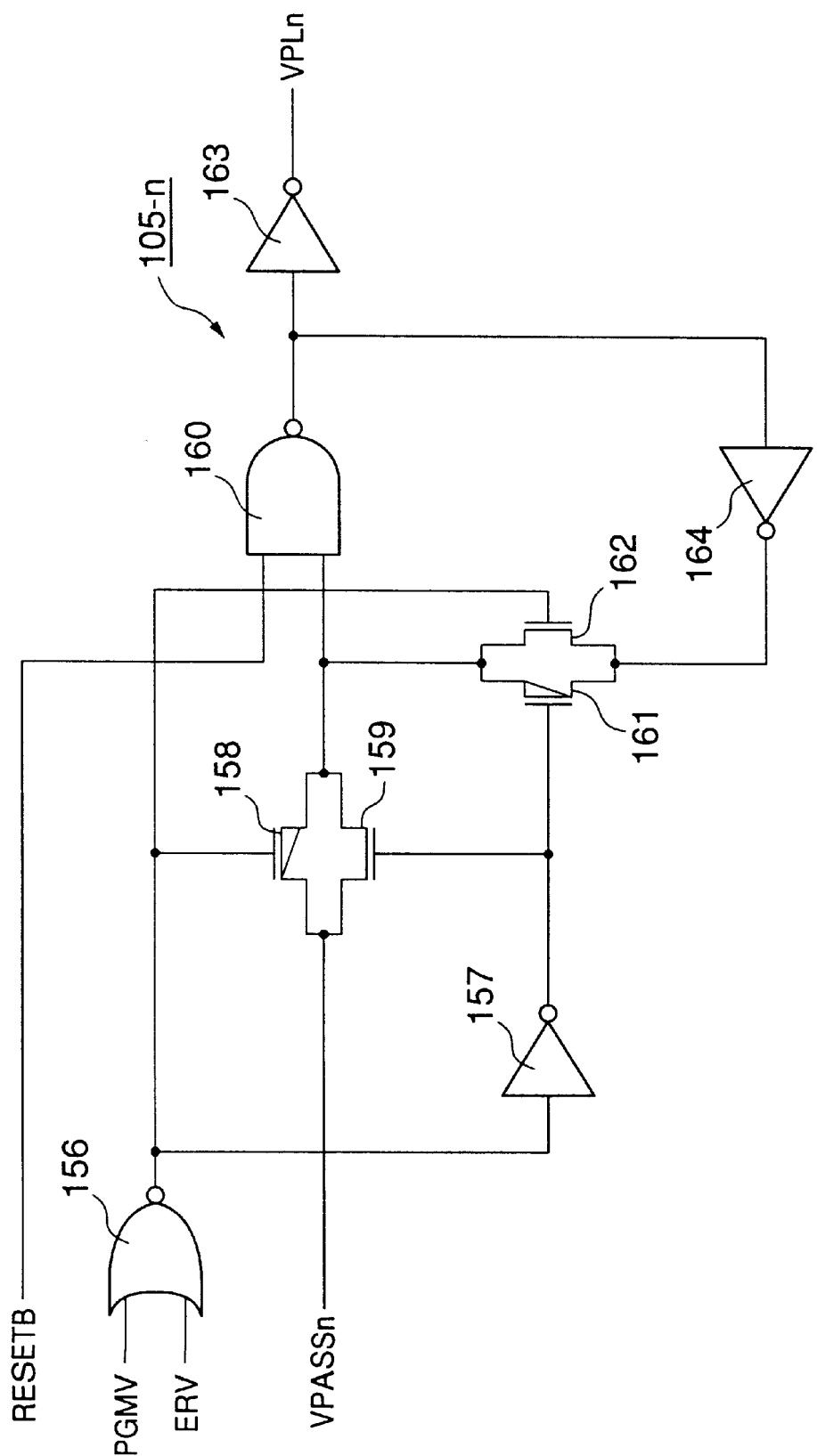
FIG. 6 is a circuit diagram of one of a plurality of subblocks of a first latch circuit in the flash memory.

FIG. 6 shows one of the subblocks of the first latch circuit 105 in the flash memory of FIG. 1.

As shown in FIG. 6, the first latch circuit 105-n receives the partial-verify-status signal VPASSn sent by the above-described verification circuit 103-n, and temporarily stores the same signal. The first latch circuit 105-n outputs a responsive signal VPLn for this signal VPASSn. The first latch circuit 105-n generally comprises an NOR gate 156, an inverter 157, a p-channel MOS transistor 158, an n-channel MOS transistor 159, an NAND gate 160, a p-channel MOS transistor 161, an n-channel MOS transistor 162, an inverter 163, and an inverter 164.

In the first latch circuit 105-n, the NOR gate 156 receives the write verify control signal PGMV and the erase verify control signal ERV, which are sent by the controller 100. The transistors 158 and 159 form a first transfer gate, and the transistors 161 and 162 form a second transfer gate. The output of the NOR gate 156 is used to select one of the first and second transfer gates. The output of the inverter 157 is sent to both the gate of the transistor 159 and the gate of the transistor 161.

The first transfer gate having the transistors 158 and 159 is provided to control the delivery of the signal VPASSn to the NAND gate 160. The second transfer gate having the transistors 161 and 162 is provided to control the latching of the signal VPASSn by the loop including the second transfer gate, the inverter 164 and the NAND gate 160.

When the output of the NOR gate 156 is set to the low level (or during the write or erase verify operation), the first transfer gate is turned on to deliver the signal VPASSn to the NAND gate 160. When the output of the NOR gate 156 is set to the high level (or the end of the write or erase verify operation), the first transfer gate is turned off and the second transfer gate is turned on to allow the latching of the signal VPASSn by the loop including the second transfer gate, the inverter 164 and the NAND gate 160.

The output of the NAND gate 160 is sent to the inverter 163, and the inverter 163 outputs the signal VPLn. The NAND gate 160 has a first input for receiving the signal VPASSn and a second input for receiving the reset signal RESETB which is sent by the controller 100. When the signal RESETB is set to the high level, the NAND gate 160 is activated. When the signal RESETB is set to the low level, the output of the NAND gate 160 is set to the high level, and the signal VPLn that is produced from the output of the NAND gate 160 inverted by the inverter 163 is set to the low level.

Figure 7:
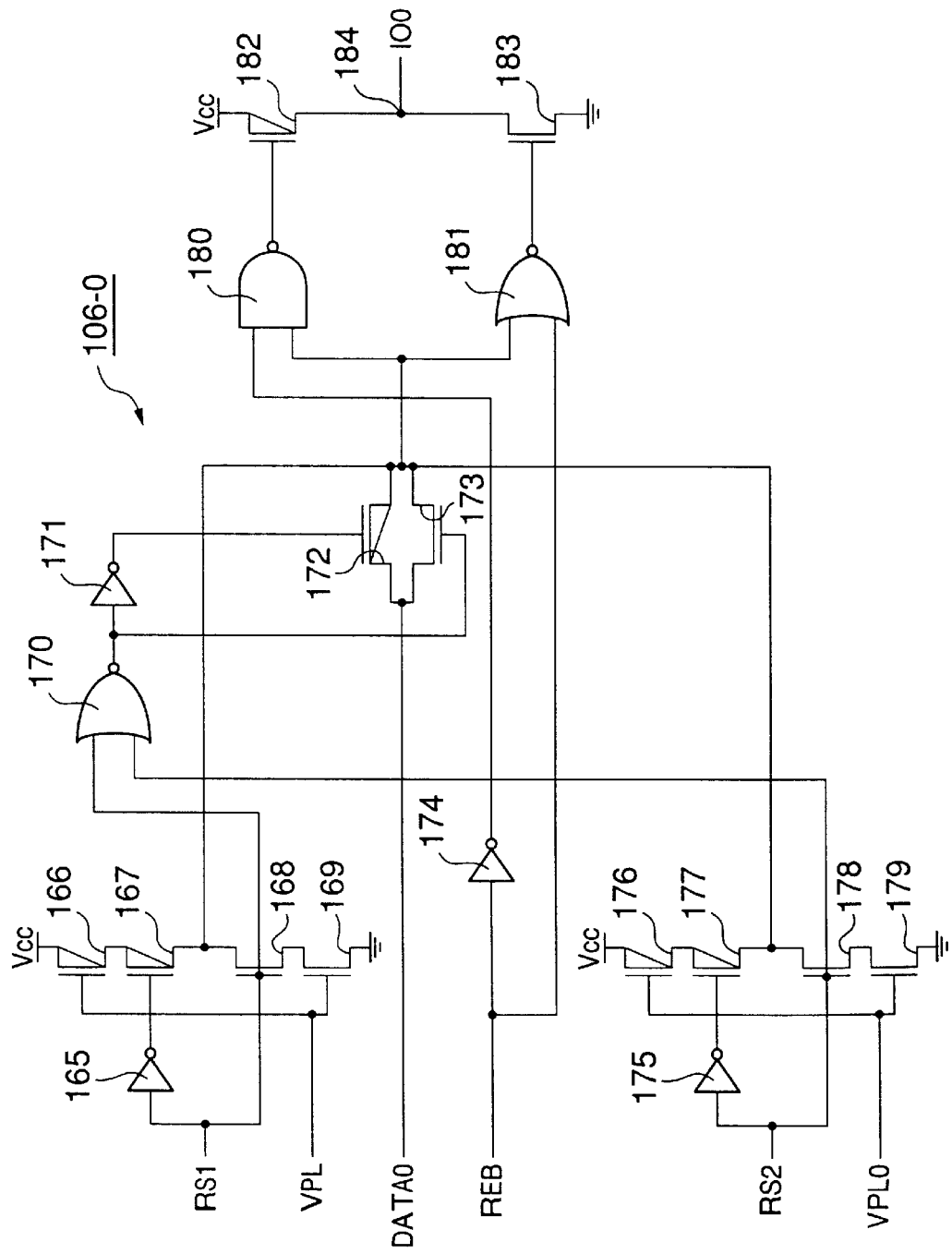
FIG. 7 is a circuit diagram of a first subblock of an output circuit in the flash memory.

FIG. 7 shows a first subblock of the output circuit 106 in the flash memory of FIG. 1.

As shown in FIG. 7, the first subblock 106-0 of the output circuit 106 generally comprises an inverter 165, a p-channel MOS transistor 166, an n-channel MOS transistor 167, a p-channel MOS transistor 168, an n-channel MOS transistor 169. The transistors 167 and 168 form a switch that is turned on or off in response to the control signal RS1 sent by the controller 100. The transistors 166 and 169 form an inverter, and the drains of the transistors 166 and 169 are connected to the transistor 167 and to the transistor 168. The control signal RS1 is inverted by the inverter 165, and the resulting signal is input to the gate of the transistor 167. The signal VPL, output by the latch circuit 107, is input to the gates of the transistors 166 and 169.

Similarly, the first subblock 106 generally comprises an inverter 175, a p-channel MOS transistor 176, an n-channel MOS transistor 177, a p-channel MOS transistor 178, an n-channel MOS transistor 179. The transistors 177 and 178 form a switch that is turned on or off in response to the control signal RS2 sent by the controller 100. The transistors 176 and 179 form an inverter, and the drains of the transistors 176 and 179 are connected to the transistor 177 and to the transistor 178. The control signal RS2 is inverted by the inverter 175, and the resulting signal is input to the gate of the transistor 177. The signal VPL0, output by the latch circuit 105-0, is input to the gates of the transistors 176 and 179.

The first subblock 106-0 further comprises an NOR gate 170, an inverter 171, an n-channel MOS transistor 173, a p-channel MOS transistor 172, an inverter 174, an NAND gate 180, an NOR gate 181, a p-channel MOS transistor 182, an n-channel MOS transistor 183, and an output terminal 184. The signal at the connection point between the transistors 167 and 168 is sent to both the NAND gate 180 and the NOR gate 181. The signal at the connection point between the transistors 177 and 178 is sent to both the NAND gate 180 and the NOR gate 181. The transistors 172 and 173 form a transfer gate which is provided to control the delivery of the data signal dataO to the NAND gate 180 and the NOR gate 181 in response to the control signals RS1 and RS2. The control signal RS1 is inverted by the inverter 165, and the resulting signal is sent to the gate of the transistor 167. The control signal RS2 is inverted by the inverter 175, and the resulting signal is sent to the gate of the transistor 177.

When at least one of the control signals RS1 and RS2 is set to the high level, the output of the NOR gate 170 is set to the low level. The transfer gate including the transistors 172 and 173 is at this time turned off, and the data signal dataO is not sent to the NAND gate 180 and the NOR gate 181. One of the data signal dataO, the inverted-state signal VPL and the inverted-state signal VPL0 is selectively sent to the NAND gate 180 and the NOR gate 181.

The NOR gate 181 includes another input for receiving the read enable signal REB sent by the controller 100. The read enable signal REB is inverted by the inverter 174. The NAND gate 180 includes another input for receiving the output of the inverter 174. The output terminal 184 is connected to the drains of the transistors 182 and 183. The transistors 182 and 183 form an output device which produces an output signal 100 in response to one of three different states depending on the combination of the read enable signal REB, the inverter 174, the NAND gate 180 and the NOR gate 181. This output signal 100 is delivered from the output terminal 184 to the first pin 100 of the input/output pins of the flash memory.

Figure 8:
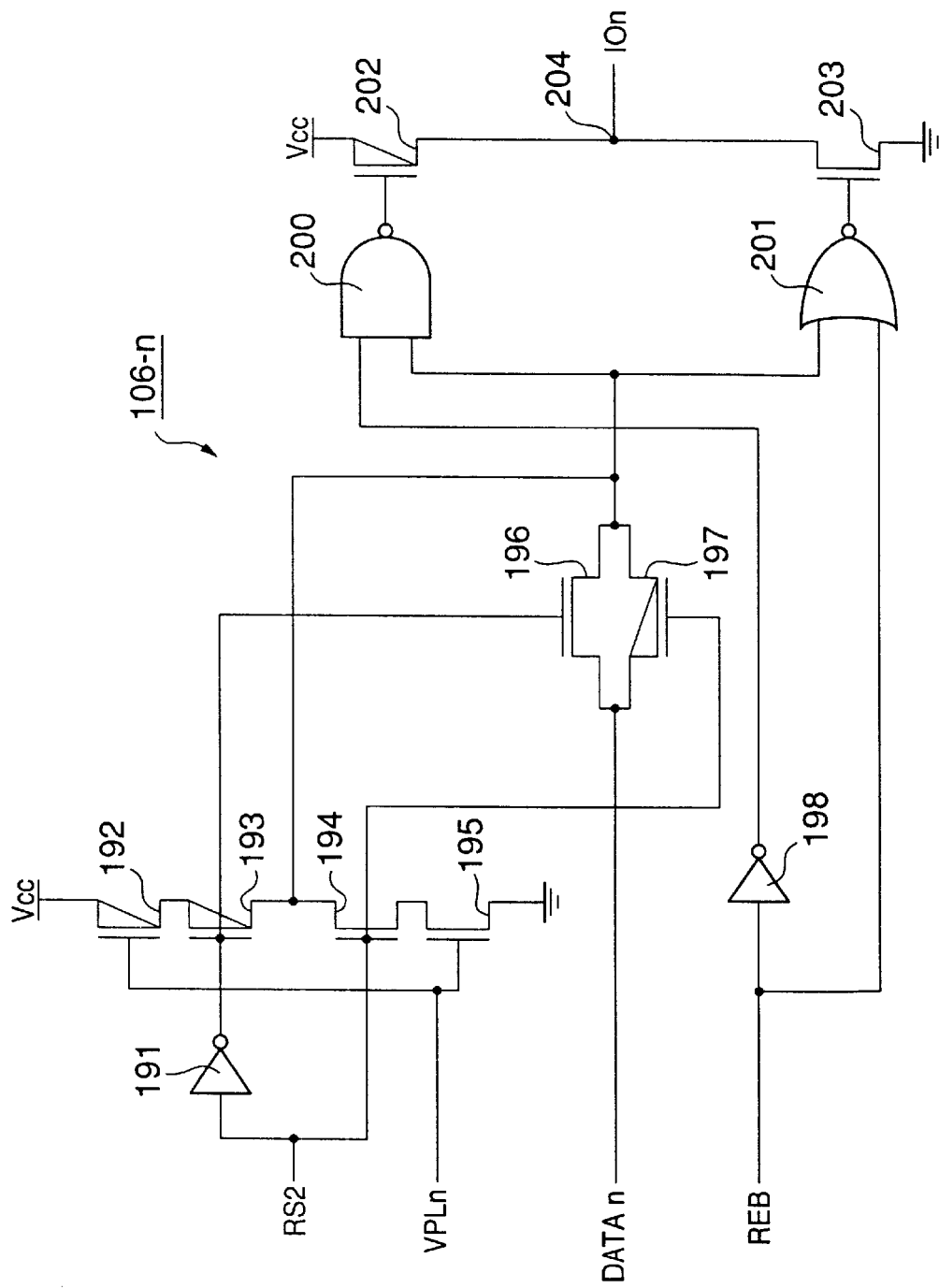
FIG. 8 is a circuit diagram of one of other subblocks of the output circuit in the flash memory.

FIG. 8 shows one of the other subblocks of the output circuit 106 in the flash memory of FIG. 1.

As shown in FIG. 8, the output-circuit subblock 106-n generally comprises an inverter 191, a p-channel MOS transistor 192, an n-channel MOS transistor 193, a p-channel MOS transistor 194, an n-channel MOS transistor 195. The transistors 193 and 194 form a switch that is turned on or off in response to the control signal RS2 sent by the controller 100. The transistors 192 and 195 form an inverter, and the drains of the transistors 192 and 195 are connected to the transistor 193 and to the transistor 194. The control signal RS2 is inverted by the inverter 191, and the resulting signal is input to the gate of the transistor 193. The signal VPLn, output by the above-described latch circuit 105-n, is input to the gates of the transistors 192 and 195.

The output-circuit subblock 106-n further comprises an n-channel MOS transistor 196, a p-channel MOS transistor 197, an inverter 198, an NAND gate 200, an NOR gate 201, a p-channel MOS transistor 202, an n-channel MOS transistor 203, and an output terminal 205. The signal at the connection point between the transistors 193 and 194 is sent to both the NAND gate 200 and the NOR gate 201. The transistors 196 and 197 form a transfer gate which is provided to control the delivery of the data signal data n to the NAND gate 200 and the NOR gate 201 in response to the control signal RS2. The control signal RS2 is inverted by the inverter 191, and the resulting signal is sent to the gate of the transistor 196.

In accordance with the level of the control signal RS2, one of the switch including the transistors 193 and 194 and the transfer gate including the transistors 196 and 197 is turned on and at the same time the other is turned off. Specifically, when the control signal RS2 is set to the high level, the signal VPLn output by the latch circuit 105-n is delivered to both the NAND gate 200 and the NOR gate 201. When the control signal RS2 is set to the low level, the data signal data n sent from the data bus is delivered to both the NAND gate 200 and the NOR gate 201.

The NOR gate 201 includes another input for receiving the read enable signal REB sent by the controller 100. The read enable signal REB is inverted by the inverter 198. The NAND gate 200 includes another input for receiving the output of the inverter 198. The output terminal 204 is connected to the drains of the transistors 202 and 203. The transistors 202 and 203 form an output device which produces an output signal IOn in response to one of three different states depending on the combination of the read enable signal REB, the inverter 198, the NAND gate 200 and the NOR gate 201. This output signal IOn is delivered from the output terminal 204 to the corresponding one of the input/output pins of the flash memory.

Figure 9:
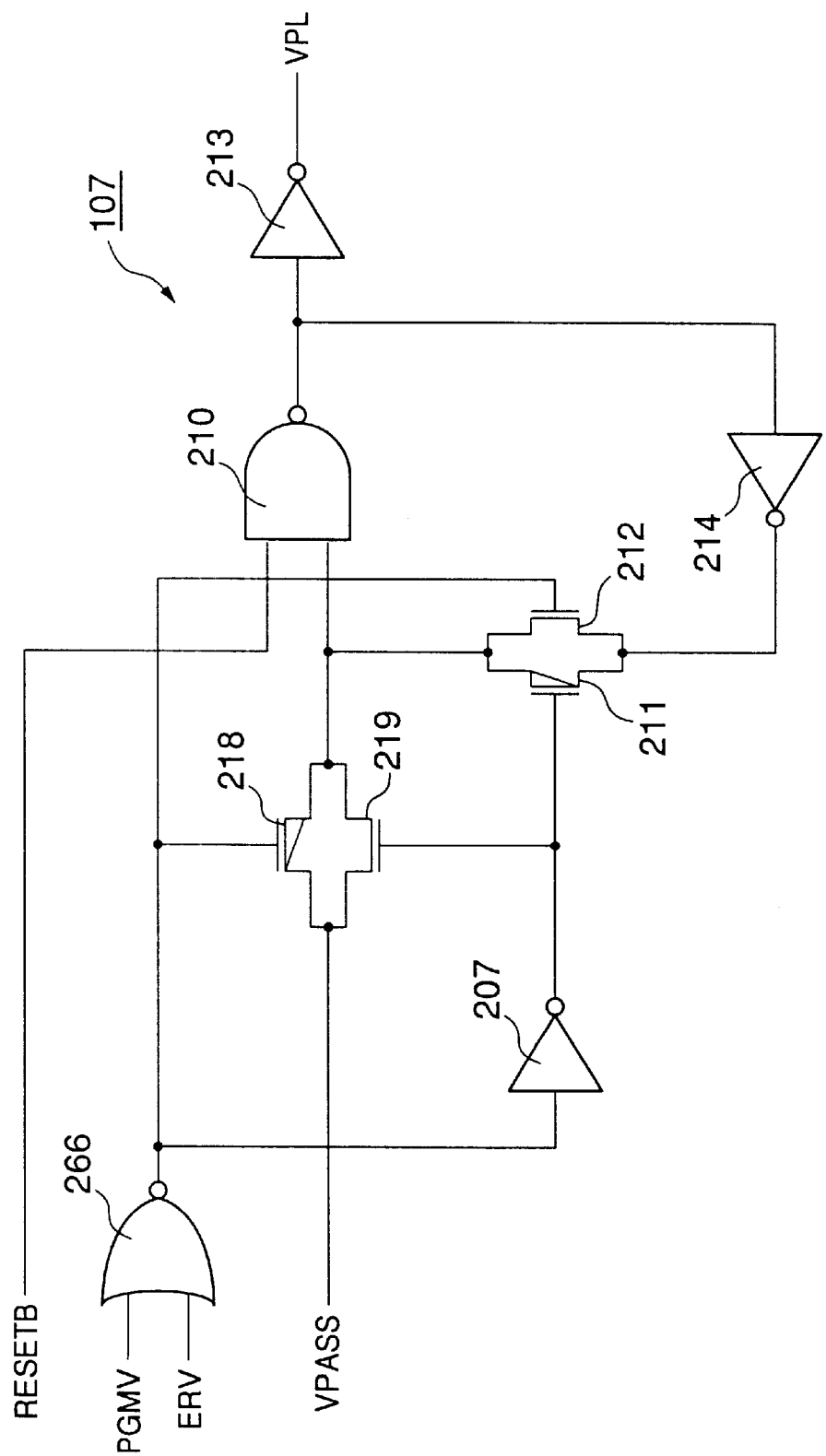
FIG. 9 is a circuit diagram of a second latch circuit in the flash memory.

FIG. 9 shows a second latch circuit in the flash memory of FIG. 1.

As shown in FIG. 9, the second latch circuit 107 receives the total-verify-status signal VPASS sent by the verify status output circuit 104, and temporarily stores the same signal. The second latch circuit 107 outputs a responsive signal VPL for this signal VPASS. The second latch circuit 107 generally comprises an NOR gate 266, an inverter 207, a p-channel MOS transistor 218, an n-channel MOS transistor 219, an NAND gate 210, a p-channel MOS transistor 211, an n-channel MOS transistor 212, an inverter 213, and an inverter 214.

In the second latch circuit 107, the NOR gate 266 receives the write verify control signal PGMV and the erase verify control signal ERV, which are sent by the controller 100. The transistors 218 and 219 form a first transfer gate, and the transistors 211 and 212 form a second transfer gate. The output of the NOR gate 266 is used to select one of the first and second transfer gates. The output of the inverter 207 is sent to both the gate of the transistor 219 and the gate of the transistor 211.

The first transfer gate having the transistors 218 and 219 is provided to control the delivery of the signal VPASS to the NAND gate 210. The second transfer gate having the transistors 211 and 212 is provided to control the latching of the signal VPASS by the loop including the second transfer gate, the inverter 214 and the NAND gate 210.

When the output of the NOR gate 266 is set to the low level (or during the write or erase verify operation), the first transfer gate is turned on to deliver the signal VPASS to the NAND gate 210. When the output of the NOR gate 266 is set to the high level (or the end of the write or erase verify operation), the first transfer gate is turned off and the second transfer gate is turned on to allow the latching of the signal VPASS by the loop including the second transfer gate, the inverter 214 and the NAND gate 210.

The output of the NAND gate 210 is sent to the inverter 213, and the inverter 213 outputs the signal VPL. The NAND gate 210 has a first input for receiving the signal VPASS and a second input for receiving the reset signal RESETB which is sent by the controller 100. When the signal RESETB is set to the high level, the NAND gate 210 is activated. When the signal RESETB is set to the low level, the output of the NAND gate 210 is set to the high level, and the signal VPL that is produced from the output of the NAND gate 210 inverted by the inverter 213 is set to the low level.

Figure 10:
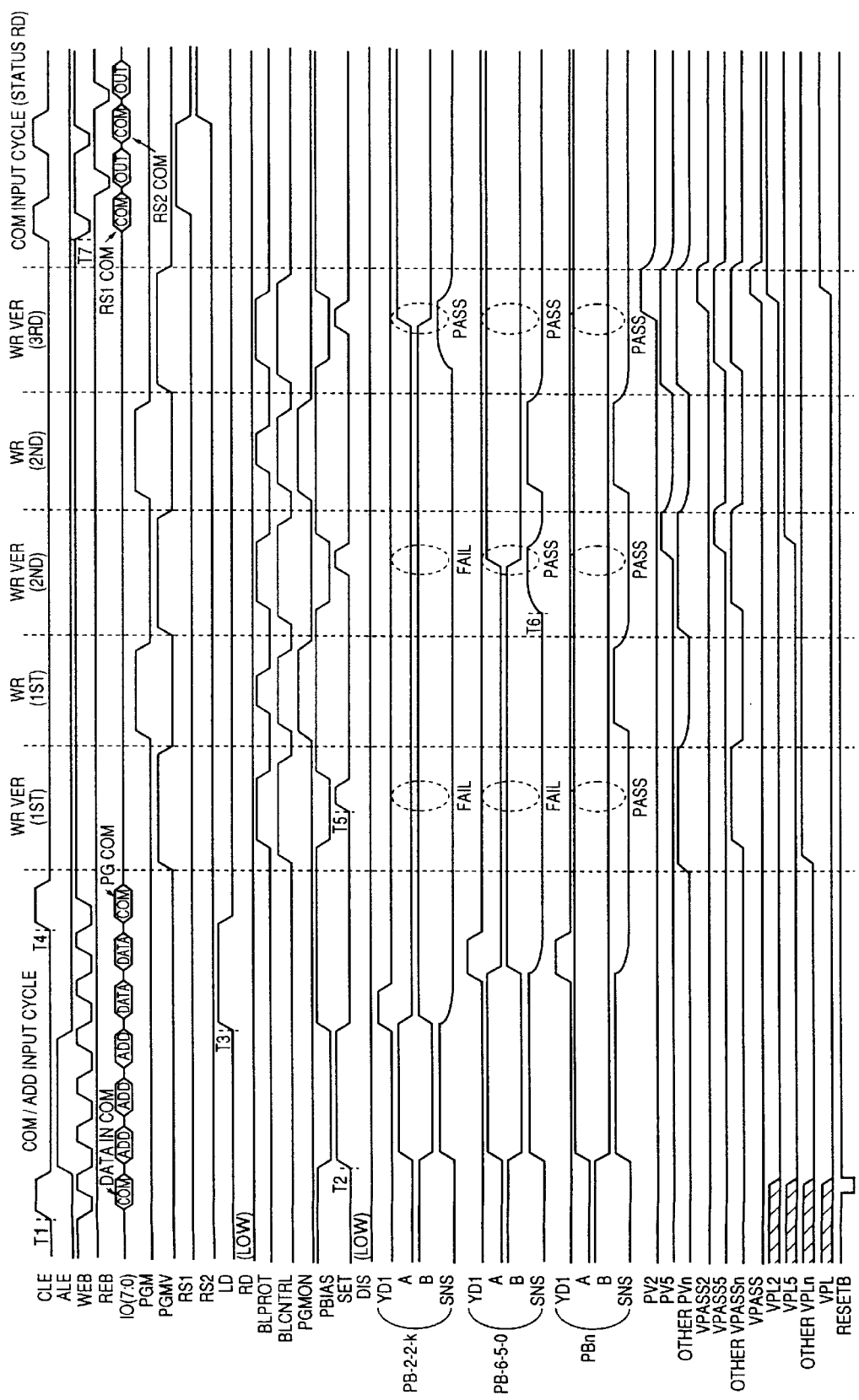
FIG. 10 is a time chart for explaining a write verify operation of the flash memory when the memory has passed the write verification.

Next, FIG. 10 is a time chart for explaining a write verify operation of the flash memory when the memory has passed (no error in) the write verification.

As previously described, the flash memory of the present embodiment is an NAND type flash memory. All the operations of the flash memory are controlled by supplying a memory control command from an external device to the flash memory.

As shown in FIG. 10, at the start (indicated by a time "T1" in FIG. 10) of the writing operation on the flash memory of the present embodiment, the control signal CLE rises. A data input command is input to the input/output pins of the flash memory (indicated by "Com"). Subsequently, the control signal ALE rises. A start address for the writing is input to the flash memory (indicated by "Add") during the high-level period of the control signal ALE.

For the purpose of simplicity of description, the time chart includes only operations of the three page buffers: the page buffer PB-2-2-k (corresponding to the memory cell connected to the 2nd input/output pin 102), the page buffer PB-6-5-0 (corresponding to the memory cell connected to the 6th input/output pin 106), and the page buffer PBn (corresponding to another memory cell connected to another input/output pin IOn), which are provided within the plurality of page buffers 102 of the flash memory.

In the time chart of FIG. 10, at a time indicated by "T2", the bias signal PBIAS falls and the set signal SET rises. The voltage (indicated by "SNS") of the sensing node 131 of each of the three page buffers rises. The transistor 125 connected to the node 121 of the latch circuit 110 is turned on, and, at the same time, the transistor 126 is turned on. The voltage (indicated by "B") of the node 121 of the latch circuit 110 falls, and the voltage (indicated by "A") of the node 120 of the latch circuit 110 rises.

At a time indicated by "T3" in FIG. 10, the control signal LD is changed from the low level to the high level. The transistor 113 of each page buffer is turned on by the change of the LD. The latch circuit 110 of each page buffer is connected to the data bus via the transistor 112 when the signal YD1 is set to the high level. When the memory cell is written, the voltages of the node 120 and the node 121 of the corresponding page buffer are inverted. When the memory cell is not written, the voltages of the node 120 and the node 121 of the corresponding page buffer remain unchanged.

In the example of FIG. 10, suppose, for example, that the page buffer PB-2-2-k and the page buffer PB-6-5-0 correspond to the memory cells which are written, and the page buffer PBn corresponds to the memory cell which is not written. For the page buffer PB-2-2-k, the voltages A and B of the nodes 120 and 121 are inverted when the signal YD1 rises. For the page buffer PB-6-5-0, the voltages A and B of the nodes 120 and 121 are inverted when the signal YD1 rises. However, for the page buffer PBn, the voltages A and B of the nodes 120 and 121 remain unchanged when the signal YD1 rises.

At a time indicated by "T4" in FIG. 10, the control signal CLE rises again. A program command is input to the flash memory (indicated by "Com"). The write and write verify operations on the flash memory start.

During the first write verify operation, at a time indicated by "T5" in FIG. 10, the set signal SET rises. However, the write verify operations for the page buffers PB-2-2-k and PB-6-5-0 have failed. The page buffer PBn corresponds to the memory cell that is not written, and the voltages A and B of the nodes 120 and 121 remain unchanged. The During the second write verify operation, at a time indicated by "T6" in FIG. 10, the voltage SNS of the sensing node 130 of the page buffer PB-6-5-0 rises. The voltages A and B of the nodes 120 and 121 are subsequently inverted. The write verify operation for the page buffer PB-6-5-0 has succeeded. However, the write verify operation for the page buffer PB-2-2-k has failed.

During the final write verify operation, both the write verify operation for the page buffers PB-2-2-k and the write verify operation for the page buffer PB-6-5-0 have succeeded.

After the end of the final write verify operation, at a time indicated by "T7" in FIG. 10, the control signal CLE rises again, and the control signal WEB falls. A read status command is input to the flash memory. The control signal RS1 rises after the command input. The first subblock 106-0 of the output circuit 106 is activated to output the signal VPL to the external device, and the other subblocks 106-1 through 106-(N-1) are activated to output the data signals data1 through data(N-1), sent from the data bus, to the external device. These signals are output from the flash memory to the external device when the read enable signal REB falls. Subsequently, the control signal RS2 rises after a second command input.

In the example of FIG. 10, the 100 signal output by the pin IO0 of the flash memory is set to the low level, which indicates that the flash memory is properly written.

Figure 11:
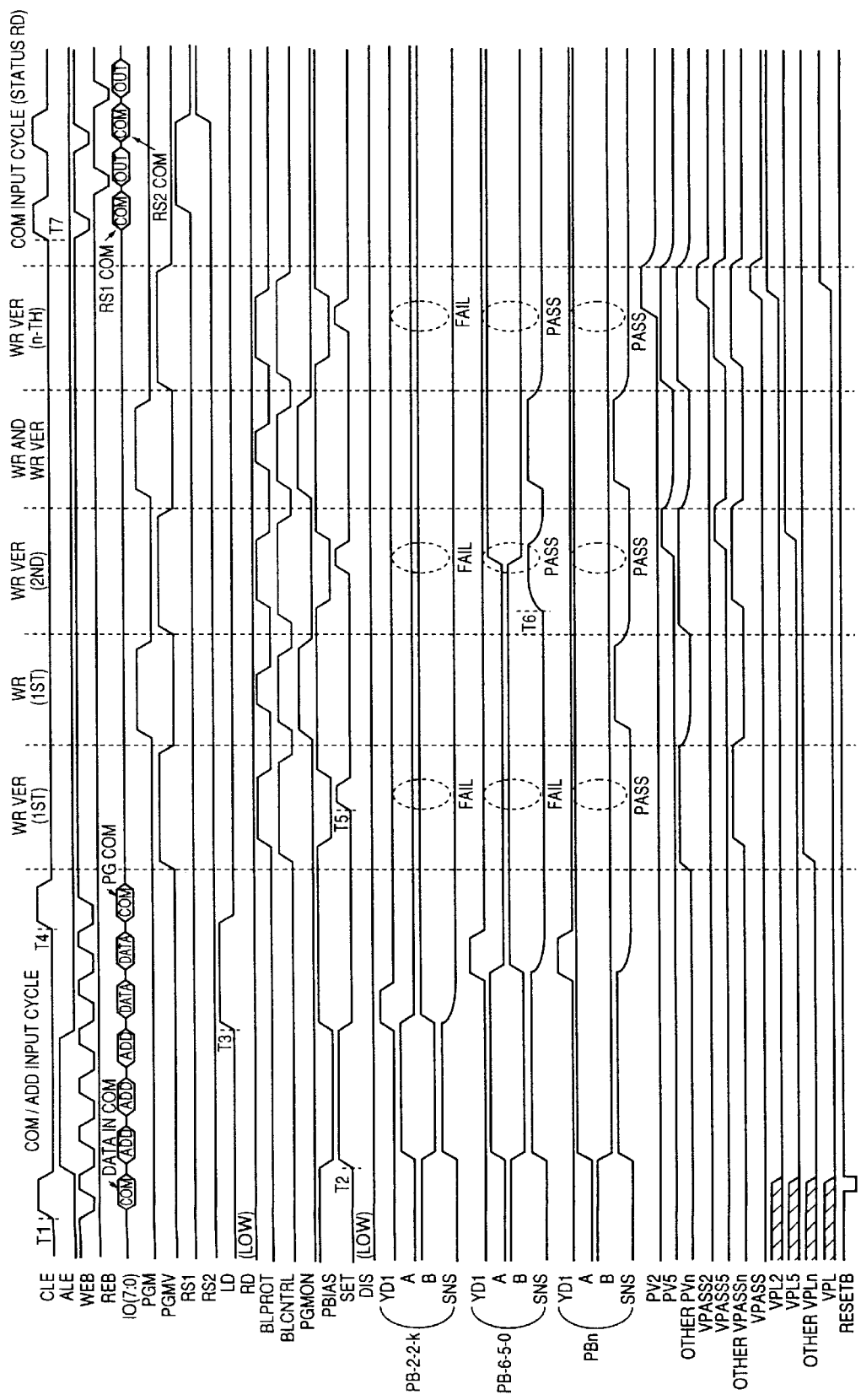
FIG. 11 is a time chart for explaining a write verify operation of the flash memory when the memory has failed the write verification.

FIG. 11 is a time chart for explaining a write verify operation of the flash memory when the memory has failed the write verification. In FIG. 11, the elements which are essentially the same as corresponding elements in FIG. 10 are designated by the same reference numerals, and a description thereof will be omitted.

In the example of FIG. 11, suppose, for example, that during the final write verify operation (or the n-th one), the write verify operation for the page buffers PB-2-2-k has failed and the write verify operation for the page buffer PB-6-5-0 has succeeded.

As the memory cell for the page buffer PB-2-2-k is not properly written, only the write verify signal PV2 is set to the low level. Other write verify signals PV0, PV1 and PV3-PV(N-1) are set to the high level. These signals are supplied from the plurality of page buffers 102 to the verification circuit 103. The verification circuit 103 outputs the verify status signals VPASS0 through VPASS(N-1).

In the example of FIG. 11, only the signal VPASS2 is set to the low level, and other signals VPASS0, VPASS1 and VPASS3-VPASS(N-1) are set to the high level. The total-verify-status signal VPASS output by the verify status output circuit 104 is set to the low level. In response to the low level of the signal VPASS, the controller 100 controls the flash memory, so that the write verify operation is further performed.

In the example of FIG. 11, the signal VPL output by the second latch circuit 107 is set to the low level. The signal VPL2 output by the first latch circuit 105 is set to the low level. Other signals VPL0, VPL1 and VPL3-VPL(N-1) output by the first latch circuit 105 are set to the high level.

Accordingly, the verify/output circuit in the nonvolatile semiconductor memory device of the present embodiment can output the verify status of each of the subblocks of N page buffers to the external device. The amount of data needed to identify the location of a defective cell is remarkably reduced in comparison with that of the conventional flash memory. The nonvolatile semiconductor memory device of the present embodiment is effective in providing high-speed access to the identification of the address of any defective cell in the memory array after it is written.

Figure 12:
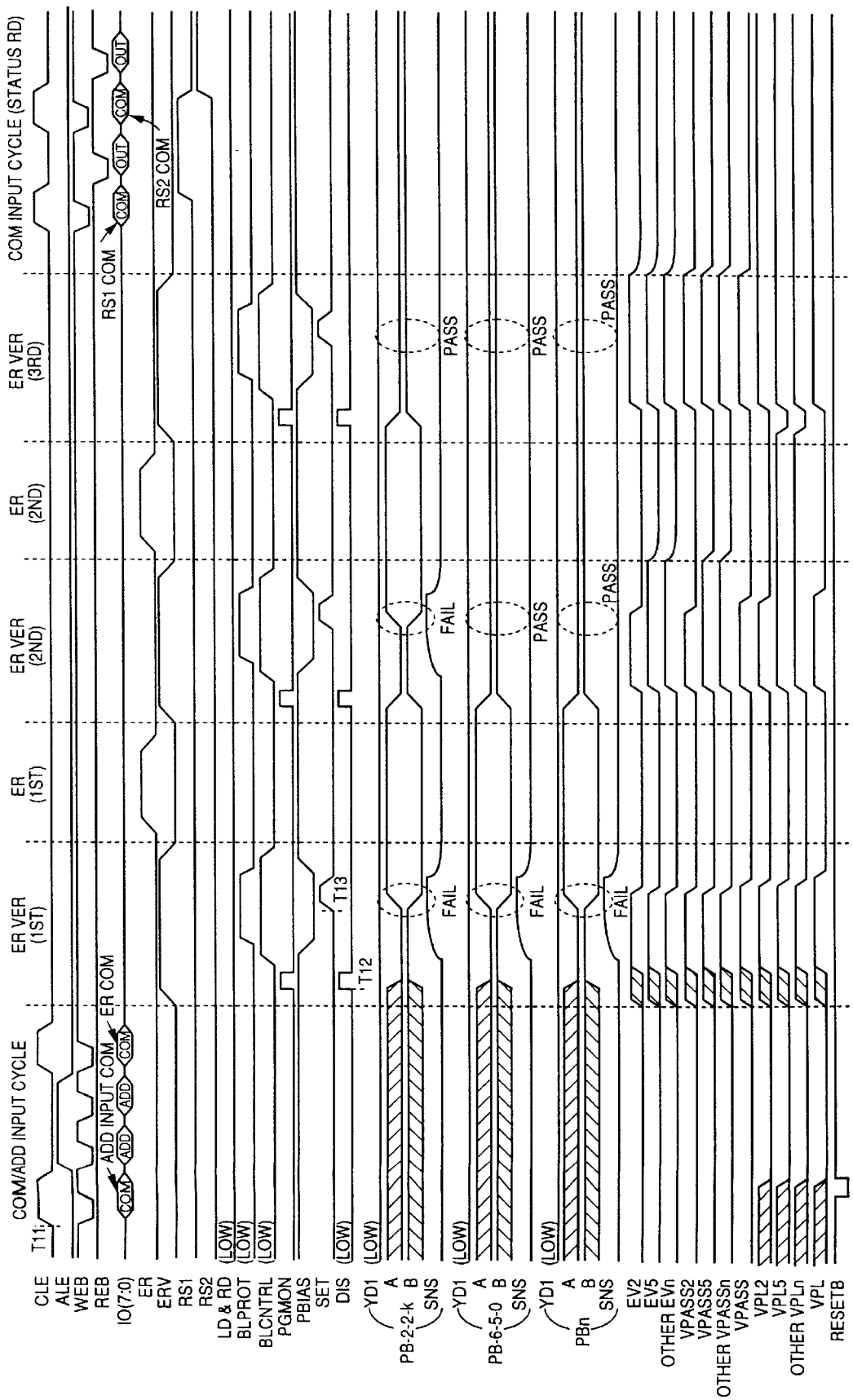
FIG. 12 is a time chart for explaining an erase verify operation of the flash memory when the memory has passed the erase verification.

Next, FIG. 12 is a time chart for explaining an erase verify operation of the flash memory when the memory has passed (no error in) the erase verification.

As shown in FIG. 12, at the start (indicated by a time "T11" in FIG. 12) of the erase operation on the flash memory of the present embodiment, the control signal CLE rises. An address input command is input to the input/output pins of the flash memory (indicated by "Com"). Subsequently, the control signal ALE rises. An address for the erasing is input to the flash memory (indicated by "Add") during the high-level period of the control signal ALE.

For the purpose of simplicity of description, the time chart includes only operations of the three page buffers: the page buffer PB-2-2-k (corresponding to the memory cell connected to the 2nd input/output pin IO2), the page buffer PB-6-5-0 (corresponding to the memory cell connected to the 6th input/output pin IO6), and the page buffer PBn (corresponding to other memory cells connected to other input/output pins IOn), which are provided within the plurality of page buffers 102 of the flash memory.

In the time chart of FIG. 12, after the erasing address is input, the control signal CLE rises again. An erase command is input to the flash memory (indicated by "Com"). The erase verify control signal ERV is changed from the low level to the high level. Then, the erase verify operations on the flash memory start.

During the first erase verify operation, at a time indicated by "T12" in FIG. 12, the control signal PGMON rises and the discharge signal DIS rises. The voltage A of the node 120 of the latch circuit 110 of each page buffer falls, and at the same time the voltage B of the node 121 rises. Subsequently, the control signal PGMON falls and the discharge signal DIS falls. After this, the voltage SNS of the sensing node 130 of each page buffer starts rising.

Further, during the first erase verify operation, at a time indicated by "T13" in FIG.12, the set signal SET rises. The voltage A of the node 120 of the latch circuit 110 of each page buffer rises, and at the same time the voltage B of the node 121 falls. The node 120 is connected to the gate of the transistor 122, and the transistor 122 is turned on. The erase verify signals EV0 through EV(N–1) output by the plurality of page buffers 102 are initially set to the low level. The control signals BLCNTRL and BLPROT are set to the low level, and the electrical connection on the bit lines BL between the memory cells of the memory array 101 and the page buffers 102 is cut off.

During the second erase verify operation, the memory cell for the page buffer PB-6-5-0 and the memory cell for the page buffer PBn are properly erased, but the memory cell for the page buffer PB-2-2-k is not properly erased. The erase verify signals EV5 and EVn are changed from the low level to the high level. The erase verify signal EV2 is set to the low level. These signals are supplied from the plurality of page buffers 102 to the verification circuit 103. The verification circuit 103 outputs the verify status signals VPASS0 through VPASS(N–1).

During the second erase verify operation, only the signal VPASS2 is set to the low level, and other signals VPASS0, VPASS1 and VPASS3-VPASS(N–1) are set to the high level.

The total-verify-status signal VPASS output by the verify status output circuit 104 is set to the low level. In response to the low level of the signal VPASS, the controller 100 controls the flash memory, so that the erase verify operation is further performed.

During the second erase verify operation, the signal VPL output by the second latch circuit 107 is set to the low level. The signal VPL2 output by the first latch circuit 105 is set to the low level. Other signals VPL0, VPL1 and VPL3-VPL(N–1) output by the first latch circuit 105 are set to the high level.

During the final write verify operation, all of the write verify operations for the page buffers PB-2-2-k, the page buffer PB-6-5-0 and the page buffer PBn have succeeded. The verify status signals VPASS0 through VPASS(N–1) are set to the high level. The total-verify-status signal VPASS output by the verify status output circuit 104 is set to the high level.

During the final erase verify operation, the signal VPL output by the second latch circuit 107 is changed from the low level to the high level. The signal VPL2 output by the first latch circuit 105 is set to the high level. Other signals VPL0, VPL1 and VPL3-VPL(N–1) output by the first latch circuit 105 are set to the high level.

After the end of the final erase verify operation, the control signal CLE rises again, and the control signal WEB falls. A read status command is input to the flash memory. The control signal RS1 rises after the command input. The first subblock 106-0 of the output circuit 106 is activated to output the signal VPL to the external device, and the other subblocks 106-1 through 106-(N–1) are activated to output the data signals data1 through data(N–1), sent from the data bus, to the external device. These signals are output from the flash memory to the external device when the read enable signal REB falls. Subsequently, the control signal RS2 rises after a second command input.

In the example of FIG. 12, the IO0 signal output by the pin IO0 of the flash memory is set to the low level, which indicates that the flash memory is properly erased.

Figure 13:
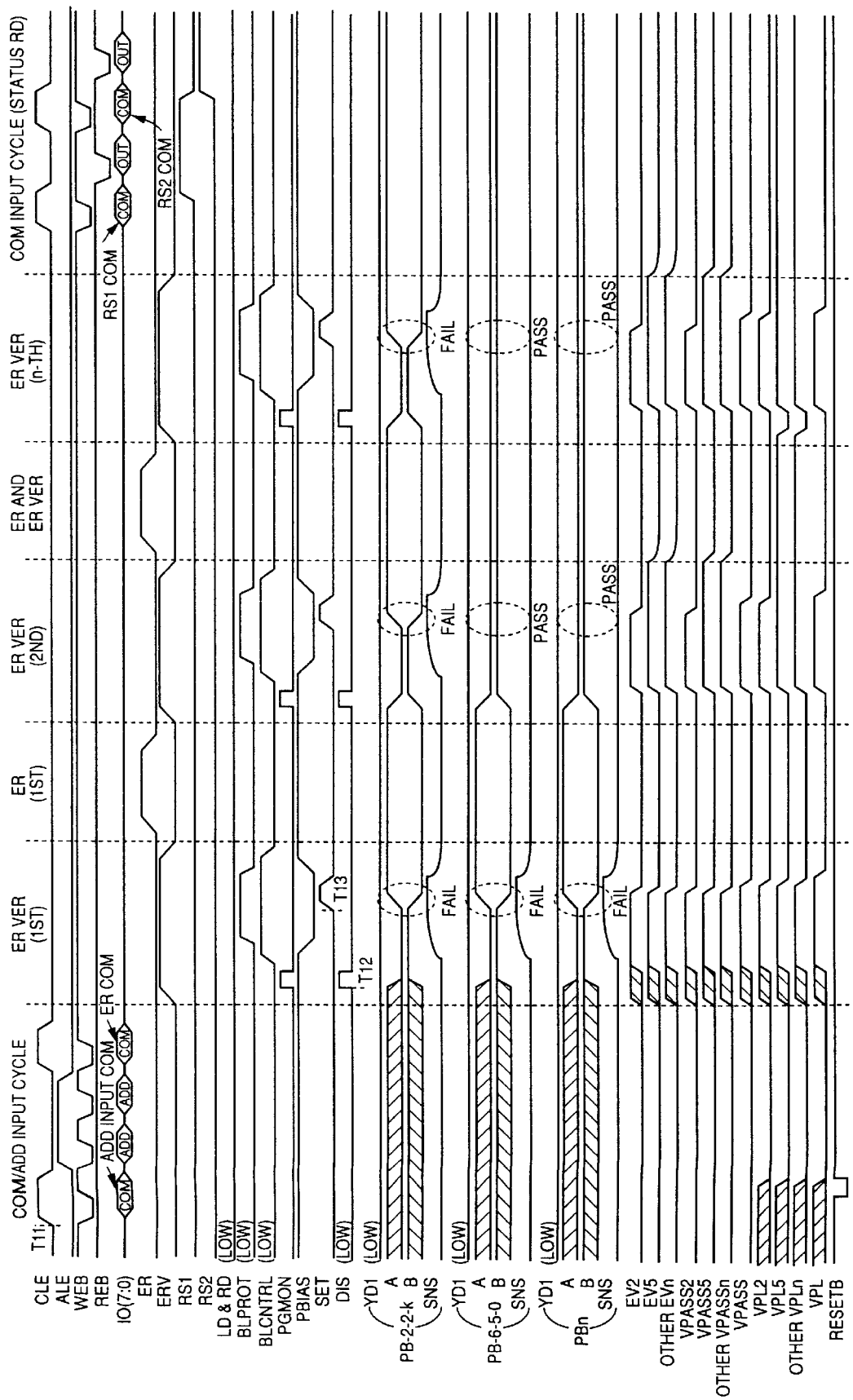
FIG. 13 is a time chart for explaining an erase verify operation of the flash memory when the memory has failed the erase verification.

Next, FIG. 13 is a time chart for explaining an erase verify operation of the flash memory when the memory has failed the erase verification. In FIG. 13, the elements which are essentially the same as corresponding elements in FIG. 12 are designated by the same reference numerals, and a description thereof will be omitted.

In the example of FIG. 13, suppose that during the final erase verify operation (or the n-th one), the erase verify operation for the page buffers PB-2-2-k has failed and the erase verify operations for the page buffers PB-6-5-0 and PBn have succeeded.

As the memory cell for the page buffer PB-2-2-k is not properly erased, only the erase verify signal EV2 is set to the low level. Other erase verify signals EV0, EV1 and EV3-EV(N–1) are set to the high level. These signals are supplied from the plurality of page buffers 102 to the verification circuit 103. The verification circuit 103 outputs the verify status signals VPASS0 through VPASS(N–1).

In the example of FIG. 13, only the signal VPASS2 is set to the low level, and other signals VPASS0, VPASS1 and VPASS3-VPASS(N–1) are set to the high level. The total-verify-status signal VPASS output by the verify status output circuit 104 is set to the low level. In response to the low level of the signal VPASS, the controller 100 controls the flash memory, so that the erase verify operation is further performed.

In the example of FIG. 13, the signal VPL output by the second latch circuit 107 is set to the low level. The signal VPL2 output by the first latch circuit 105 is set to the low level. Other signals VPL0, VPL1 and VPL3-VPL(N–1) output by the first latch circuit 105 are set to the high level.

Accordingly, the verify/output circuit in the nonvolatile semiconductor memory device of the present embodiment can output the verify status of each of the subblocks of N page buffers to the external device. The amount of data needed to identify the location of a defective cell is remarkably reduced in comparison with that of the conventional flash memory. The nonvolatile semiconductor memory device of the present embodiment is effective in providing high-speed access to the identification of the address of any defective cell in the memory array after it is erased.

Figure 14:
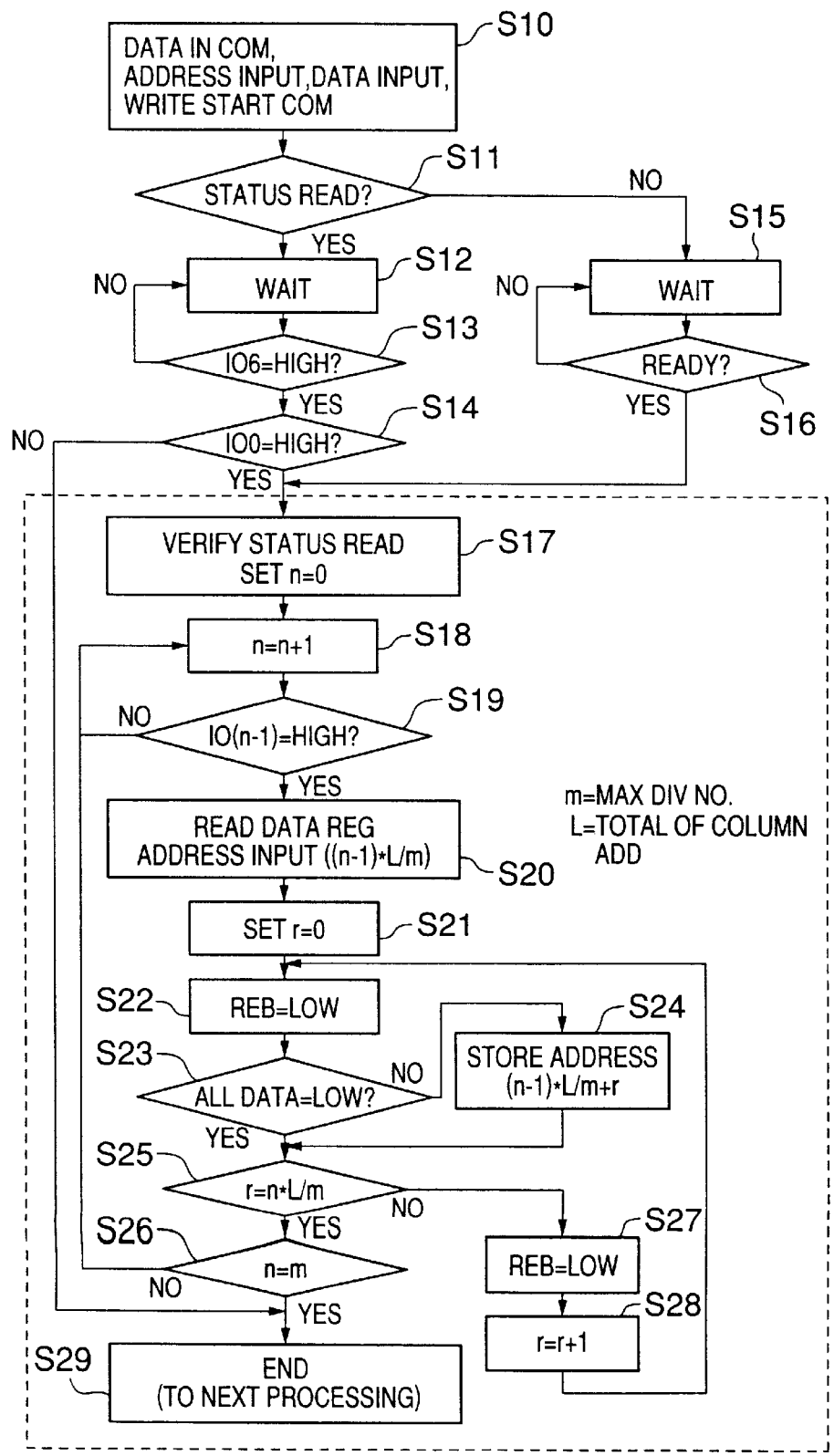
FIG. 14 is a flowchart for explaining a defect locating process to identify the location of a defective cell in the flash memory after the end of the write verify operation.

Next, FIG. 14 shows a defect locating process to identify the location of a defective cell in the flash memory after the end of the write verify operation. Suppose, for example, that the write verify operation as shown in FIG. 10 or FIG. 11 is carried out before a start of the defect locating process of FIG. 14.

When starting the defect locating process of FIG. 14, the flash memory will have been written in accordance with the data input command, the address/data input and the write start command, and the flash memory is set, at the end of the writing operation, in a status read mode (S10).

It is determined whether the flash memory is in the status read mode (S11). When the result at the step S11 is affirmative, the control is transferred to a loop which waits for the setting of the signal output by the pin I/O6 to the high level (S12, S13). When the signal at the pin I/O6 is set to the high level, it is then determined whether the signal output by the pin IO0 is set to the high level (S14).

When the result at the step S11 is negative, it is determined that the flash memory is not yet in the status read mode. The control is transferred to a loop which waits for a certain time period to have elapsed, so that the flash memory is set in the status read mode (S15, S16).

When the result at the step S14 is affirmative, it is determined that any defective cell in the flash memory at the end of the write operation will have been detected. The control is transferred to the next step S17.

On the other hand, when the result at the step S14 is negative, it is determined that all the memory cells in the flash memory are properly written. The control is transferred to the final step S29 without performing the subsequent steps. At the step S29, the defect locating process of FIG. 14 ends and the control is transferred to a next external process (not shown) which the host system has to perform.

At the step S17, the verify-status read operation is started, and the variable "n" is initially set to zero (S17). The value of the variable "n" corresponds to the number N of the memory cells in the memory array that are written at a time. The variable "n" is incremented (n=n+1) (S18). It is determined whether the signal output by the pin IO(n-1) is set to the high level (Sl9).

When the result at the step S19 is negative, the above steps S18 and S19 are repeated for the following input/output pin. When the result at the step S19 is affirmative, the control is transferred to the new step S20.

At the step S20, the read data register operation is started, and the address ((n-1)*L/m) (where m is the maximum division number and L is the total of the column addresses) is input to the read data register (S20). After the step S20 is performed, the variable "r" is set to zero (r=0) (S21). A sum of the variable "r" and the input address ((n-1)*L/m) is used by the read data register as the address to check one of data bits in the memory cells included in the memory range.

After the step S21 is performed, the read enable signal REB is set to the low level (S22). After the step S22 is performed, it is determined that all the data bits, included in the memory range indicated by the read data register, are set to the low level (S23).

When the result at the step S23 is negative, it is determined that a defective cell exists in the memory range indicated by the read data register. The read data address ((n-1)*L/m+r) at that time is stored (S24). After the step S24 is performed, the control is transferred to the next step S25.

When the result at the step S23 is affirmative, it is determined that no defective cell exists in the memory range indicated by the read data register. The control is transferred to the next step S25 without performing the step S24.

At the step S25, it is determined whether the variable "r" is equal to the value n*L/m (S25). When the result at the step S25 is negative, the read enable signal REB is set to the low level so that the read condition is withdrawn (S27). The variable "r" is incremented (r=r+1) (S28). After the step S28 is performed, the above step S22 is repeated.

On the other hand, when the result at the step S25 is affirmative, it is determined whether the variable "n" is equal to the maximum division number "m" (S26). When the result at the step S26 is affirmative, it is determined that the variable "n" is already incremented to the number N of the memory cells which are written at a time. At the final step S29, the defect locating process of FIG. 14 ends, and the control is transferred to the next external process (not shown) which the host system has to perform.

When the result at the step S26 is negative, it is determined that the variable "n" is not yet incremented to the number N of the memory cells which are written at a time. The above step S18 is repeated to again increment the variable "n" (n=n+1), and the subsequent steps S19 to S28 are repeated for the variable "n+1".

By carrying out the defect locating process of FIG. 14 by using the read data register, it is possible to quickly identify the location of a defective cell in the flash memory after the end of the write verify operation. If the specific address of the defective cell in the flash memory is detected, the host system can perform a desired following process by using the detected address.

In the above-described process of FIG. 14, the signal output by the pin 100 of the flash memory is used to confirm the presence of a defective cell, and thereafter the address of the defective cell in the memory device is determined. Alternatively, the signal output by the pin 100 of the memory device may be used to identify the address of the defective cell in the memory device, at the same time as the confirmation of the presence of the defective cell.

The above-described process of FIG. 14 uses the status read operation at the initial stages. Alternatively, the defect locating process may be configured such that the status read operation at the initial stages is not used and the verify status read operation is performed at the initial stages.

Figure 15:
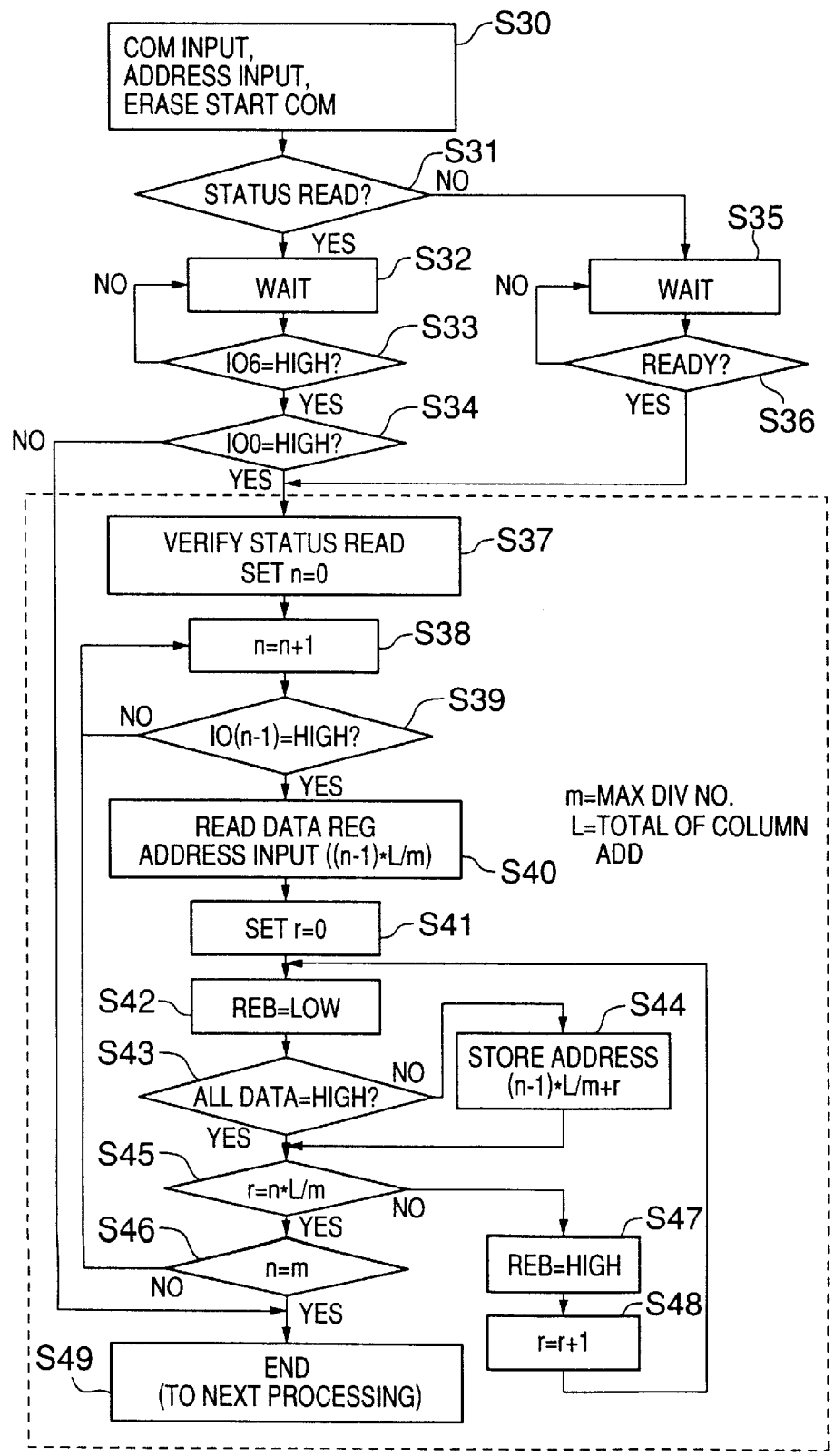
FIG. 15 is a flowchart for explaining a defect locating process to identify the location of a defective cell in the flash memory after the end of the erase verify operation.
Figure 16:
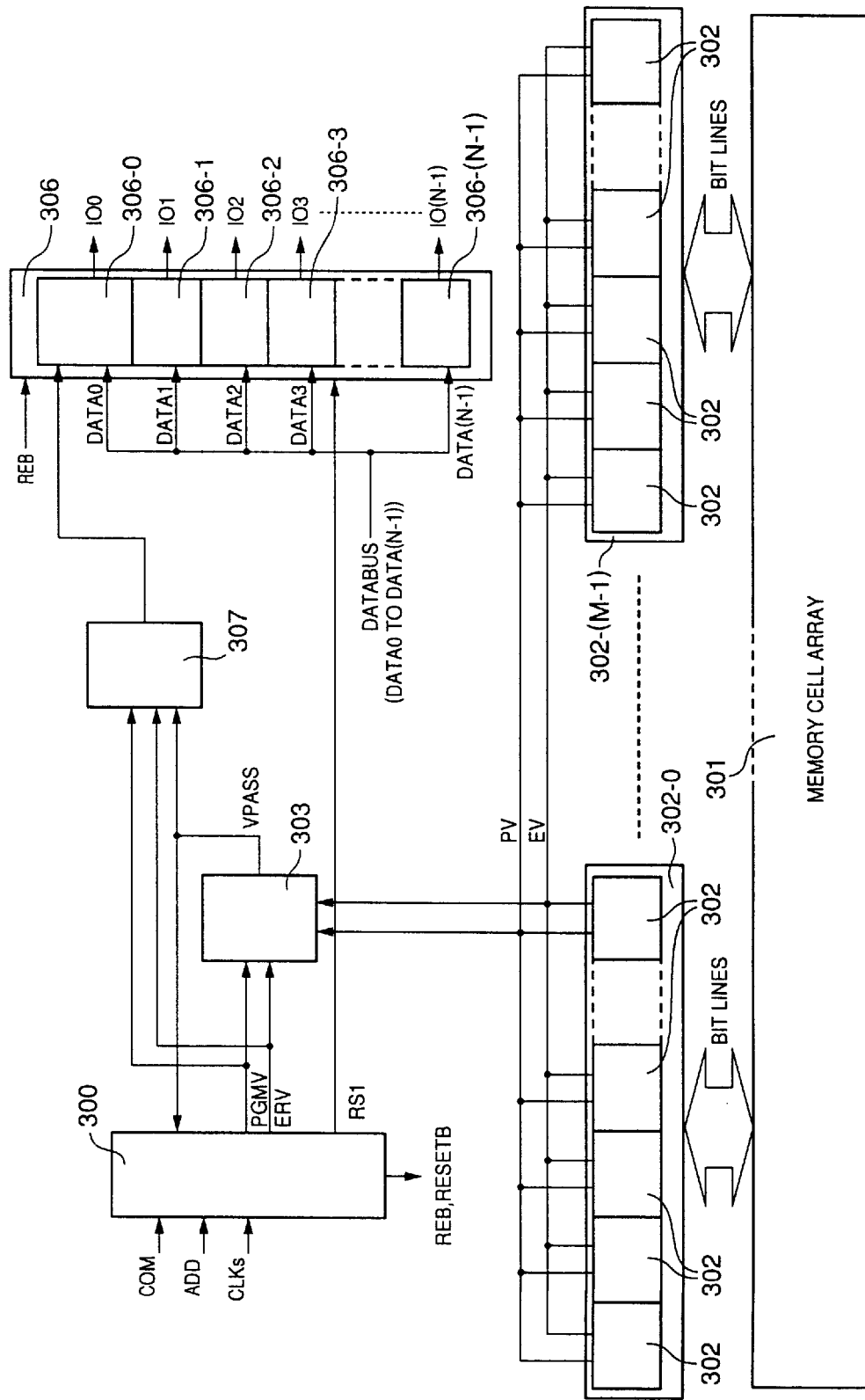
FIG. 16 is a block diagram of a conventional flash memory.

FIG. 15 shows a defect locating process to identify the location of a defective cell in the flash memory after the end of the erase verify operation. Suppose, for example, that the erase verify operation as shown in FIG. 12 or FIG. 13 has been carried out before a start of the defect locating process of FIG. 15.

When starting the defect locating process of FIG. 15, the flash memory is erased in accordance with the command input, the address input and the erase start command, and the flash memory is set, at the end of the erasing operation, in a status read mode (S30).

It is determined whether the flash memory is in the status read mode (S31). When the result at the step S31 is affirmative, the control is transferred to a loop which waits for the setting of the signal output by the pin IO6 to the high level (S32, S33). When the signal at the pin IO6 is set to the high level, it is determined whether the signal output by the pin IO0 is set to the high level (S34).

When the result at the step S31 is negative, it is determined that the flash memory is not yet in the status read mode. The control is transferred to a loop which waits for a certain time period to have elapsed, so that the flash memory is set in the status read mode (S35, S36).

When the result at the step S34 is affirmative, it is determined that any defective cell in the flash memory at the end of the erase operation has been detected. The control is transferred to the next step S37.

On the other hand, when the result at the step S34 is negative, it is determined that all the memory cells in the flash memory are properly erased. The control is transferred to the final step S49 without performing the subsequent steps. At the step S49, the defect locating process of FIG. 15 ends and the control is transferred to a next external process (not shown) which the host system has to perform.

At the step S37, the verify-status read operation is started, and the variable "n" is initially set to zero (S37). The value of the variable "n" corresponds to the number N of the memory cells in the memory array that are erased at a time. The variable "n" is incremented (n=n+1) (S38). It is determined whether the signal output by the pin IO(n-1) is set to the high level (S39).

When the result at the step S39 is negative, the above steps S38 and S39 are repeated for the following input/output pin. When the result at the step S39 is affirmative, the control is transferred to the new step S40.

At the step S40, the read data register operation is started, and the address ((n-1)*L/m) (where m is the maximum division number and L is the total of the column addresses) is input to the read data register (S40). After the step S40 is performed, the variable "r" is set to zero (r=0) (S41). A sum of the variable "r" and the input address ((n−1)*L/m) is used by the read data register as the address to check one of data bits in the memory cells included in the memory range.

After the step S41 is performed, the read enable signal REB is set to the low level (S42). After the step S42 is performed, it is determined that all the data bits, included in the memory range indicated by the read data register, are set to the low level (S43).

When the result at the step S43 is negative, it is determined that a defective cell exists in the memory range indicated by the read data register. The read data address ((n−1)*L/m+r) at that time is stored (S44). After the step S44 is performed, the control is transferred to the next step S45.

When the result at the step S43 is affirmative, it is determined that no defective cell exists in the memory range indicated by the read data register. The control is transferred to the next step S45 without performing the step S44.

At the step S45, it is determined whether the variable "r" is equal to the value n*L/m (S45). When the result at the step S45 is negative, the read enable signal REB is set to the high level so that the read condition is withdrawn (S47). The variable "r" is incremented (r=r+1) (S48). After the step S48 is performed, the above step S42 is repeated.

On the other hand, when the result at the step S45 is affirmative, it is determined whether the variable "n" is equal to the maximum division number "m" (S46). When the result at the step S46 is affirmative, it is determined that the variable "n" is already incremented to the number N of the memory cells which are written at a time. At the final step S49, the defect locating process of FIG. 15 ends, and the control is transferred to the next external process (not shown) which the host system has to perform.

When the result at the step S46 is negative, it is determined that the variable "n" is not yet incremented to the number N of the memory cells which are written at a time. The above step S38 is repeated to again increment the variable "n" (n=n+1), and the subsequent steps S39 to S48 are repeated for the variable "n+1".

By carrying out the defect locating process of FIG. 15 by using the read data register, it is possible to quickly identify the location of a defective cell in the flash memory after the end of the erase verify operation. If the specific address of the defective cell in the flash memory is detected, the host system can perform a desired following process by using the detected address.

In the above-described process of FIG. 15, the signal output by the pin IO0 of the flash memory is used to confirm the presence of a defective cell, and thereafter the address of the defective cell in the memory device is determined. Alternatively, the signal output by the pin IO0 of the memory device may be used to identify the address of the defective cell in the memory device, at the same time as the confirmation of the presence of the defective cell.

The above-described process of FIG. 15 uses the status read operation at the initial stages. Alternatively, the defect locating process may be configured such that the status read operation at the initial stages is not used and the verify status read operation is performed at the initial stages.

In the nonvolatile semiconductor memory device of the above-described embodiment, the flash memory includes a plurality of input/output pins, and the number of the input/output pins may be the same as the number N of the memory cells that are written or erased at a time.

In the nonvolatile semiconductor memory device of the above-described embodiment, the verify/output circuit may output the verify status to the external device in response to a predetermined command that is externally input to the memory device.

In the nonvolatile semiconductor memory device of the above-described embodiment, the memory device includes a plurality of input/output pins, and the verify/output circuit outputs the verify status from the pin IO0 among the plurality of input/output pins to the external device. The verify status output by the verify/output circuit may be selected for indicating the verify status for all the M subblocks or for indicating the verify status for part of the M subblocks.

Further, in the nonvolatile semiconductor memory device of the above-described embodiment, the verify/output circuit may include the first latch circuit which temporarily stores the verify status produced by the verify/output circuit.

The present invention is not limited to the above-described preferred embodiments, and variations and modifications may be made without departing from the scope of the present invention.

Further, the present invention is based on Japanese priority application No. 11-210843, filed on Jul. 26, 1999, the entire contents of which are hereby incorporated by reference.

What is claimed is:

1. A nonvolatile semiconductor memory device having an array of memory cells in columns and rows, and having word lines and bit lines provided in orthogonal directions, the memory cells for each column sharing one of the bit lines, and the memory cells for each row sharing one of the word lines, comprising:

a plurality of subblocks of N page buffers where N is a given positive integer, the N page buffers for each subblock temporarily storing data bits that are written to N memory cells at a time in the memory array in response to a selected one of the word lines; and a verify/output circuit which produces, in response to signals output by the plurality of subblocks of N page buffers, a verify status of each of the respective subblocks that indicates whether the data bits are properly written to the N memory cells, the verify/output circuit outputting the verify status of at least one of the plurality of subblocks to an external device.

2. The nonvolatile semiconductor memory device according to claim 1, wherein the memory device includes a plurality of input/output pins, the number of the input/output pins being at least the number N of the memory cells that have been written to at a time.

3. The nonvolatile semiconductor memory device according to claim 1, wherein the verify/output circuit outputs the verify status to the external device in response to a predetermined command that is input to the memory device.

4. The nonvolatile semiconductor memory device according to claim 1, wherein the memory device includes a plurality of input/output pins, the verify/output circuit outputting the verify status from one of the input/output pins to the external device, the output verify status being selected for indicating the verify status for all the plurality of subblocks or for indicating the verify status for part of the plurality of subblocks.

5. The nonvolatile semiconductor memory device according to claim 1, wherein the verify/output circuit includes a latch circuit which temporarily stores the verify status produced by the verify/output circuit.

6. A nonvolatile semiconductor memory device having an array of memory cells in columns and rows, and having word lines and bit lines provided in orthogonal directions, the memory cells for each column sharing one of the bit lines, and the memory cells for each row sharing one of the word lines, comprising:

a plurality of subblocks of N page buffers where N is a given positive integer, the N page buffers for each subblock temporarily storing data bits that are erased from memory cells at a time in the memory array; and a verify/output circuit which produces, in response to signals output by the plurality of subblocks of N page buffers, a verify status of each of the respective subblocks that indicates whether the data bits are properly erased from the memory cells, the verify/output circuit outputting the verify status of at least one of the plurality of subblocks to an external device.

7. The nonvolatile semiconductor memory device according to claim 6, wherein the memory device includes a plurality of input/output pins, the number of the input/output pins being at least the number N of the memory cells that have been erased from at a time.

8. The nonvolatile semiconductor memory device according to claim 6, wherein the verify/output circuit outputs the verify status to the external device in response to a predetermined command that is input to the memory device.

9. The nonvolatile semiconductor memory device according to claim 6, wherein the memory device includes a plurality of input/output pins, the verify/output circuit outputting the verify status from one of the input/output pins to the external device, the output verify status being selected for indicating the verify status for all the plurality of subblocks or for indicating the verify status for part of the plurality of subblocks.

10. The nonvolatile semiconductor memory device according to claim 6, wherein the verify/output circuit includes a latch circuit which temporarily stores the verify status produced by the verify/output circuit.

* * * * *